(12) United States Patent
Walker et al.

(10) Patent No.: US 6,890,786 B2
(45) Date of Patent: May 10, 2005

(54) WAFER SCALE PROCESSING

(75) Inventors: Tobias W. Walker, Louisville, CO (US); Douglas J. McKnight, Boulder, CO (US); Kam Wan, Lafayette, CO (US)

(73) Assignee: Brillian Corporation, Tempe, AZ (US)

( * ) Notice: Subject to any disclaimer, the term of this patent is extended or adjusted under 35 U.S.C. 154(b) by 0 days.

(21) Appl. No.: 10/131,452

(22) Filed: Apr. 22, 2002

(65) Prior Publication Data

US 2002/0187593 A1 Dec. 12, 2002

Related U.S. Application Data

(62) Division of application No. 09/619,969, filed on Jul. 20, 2000, now Pat. No. 6,476,415.

(51) Int. Cl.⁷ ............................................... H01L 21/00
(52) U.S. Cl. .................. 438/48; 438/128; 438/149; 438/151; 438/157; 438/283; 438/723; 257/59; 257/72; 257/644; 257/650; 349/73; 349/153; 349/158; 349/187; 349/190

(58) Field of Search ............................ 257/59, 72, 644, 257/650; 349/73, 153, 158, 187, 190

(56) References Cited

U.S. PATENT DOCUMENTS

| | | | | |
|---|---|---|---|---|
| 5,953,087 A | * | 9/1999 | Hoyt | ............................ 349/58 |
| 6,275,277 B1 | * | 8/2001 | Walker et al. | ............... 349/113 |
| 6,693,688 B1 | * | 2/2004 | Hisatake et al. | ............ 349/113 |

* cited by examiner

*Primary Examiner*—Hoai Pham
*Assistant Examiner*—Wai-Sing Louie
(74) *Attorney, Agent, or Firm*—Baker Botts L.L.P.

(57) ABSTRACT

This invention relates to a method of fabricating a light modulation system having a semiconductor substrate. In one exemplary method, an optical layer is applied over a semiconductor substrate which includes a plurality of integrated circuits. Each of these integrated circuits is capable of creating a separate display device. A protective layer is then applied over the optical layer. The plurality of integrated circuits is then singulated. Various other embodiments of apparatuses and methods are disclosed.

45 Claims, 37 Drawing Sheets

WAFER SCALE PROCESSING

CROSS-REFERENCE TO RELATED APPLICATIONS

This is a divisional of Application No. 09/619,969, filed Jul. 20, 2000, now U.S. Pat. No. 6,476,415 B1, issued Nov. 5. 2002.

BACKGROUND OF THE INVENTION

1. Field of the Invention

The invention relates the fabrication of liquid crystal display light modulation systems on a semiconductor substrate by means of a wafer-scale process.

2. Background Information

Conventional flat-panel displays use electroluminescent materials or liquid crystals in conjunction with incident light to produce high quality images in products such as digital wristwatches, calculators, panel meters, thermometers, and industrial products. Liquid crystals are a state of matter that mixes the droplet or pouring property of a liquid and the long-range order property of a solid. This combination allows an optical activity having a magnitude without parallel in either solids or liquids. Further, when a magnetic or electrical field is applied normal to the liquid crystal material, the liquid crystal material forms a localized monocrystal that is polar in character. This localized polarization of the liquid crystal material affects the travel path of light incident to the liquid crystal material. By controlling the electrical field applied across the liquid crystal material, the travel path of light incident to the liquid crystal material can be controlled to help produce high quality images.

Modern approaches for developing high quality liquid crystal displays (LCDs), also referred to as liquid crystal spatial light modulators (SLMs), utilize an active-matrix approach where thin-film transistors (TFTs) are operationally co-located with a matrix of LCD pixels. The active-matrix approach using TFT-compatible LCDs eliminates cross talk between pixels to allow finer gray scales. Foe example, see U.S. Pat. No. 5,767,828 entitled *Method and Apparatus for Displaying Grey-Scale or Color Images from Binary Images* and invented by an inventor of the below disclosed invention.

Flat-panel displays employing LCD panels generally include five different layers: A white light source, a first polarizing filter that is mounted on one side of a circuit panel on which the TFTs are assembled in arrays to form pixels, a filter plate containing at least three primary colors arranged into pixels, and a second polarizing filter. A volume between the circuit panel and the filter plate is filled with a liquid crystal material. U.S. Pat. No. 5,868,951 entitled *Electro-Optical Device and Method* and co-invented by an inventor of the below disclosed invention relates to flat-panel displays.

Nematic liquid crystal material is frequently used in LCDs since its properties are well understood and it is easy to align. This material will not rotate polarized light when an electric field is applied across it between the circuit panel and a ground affixed to the filter plate. The first polarizing filter generally converts the incident light into linearly polarized light. When a particular pixel of the display is turned on, the liquid crystal material rotates the polarized light being transmitted through the material. Thus, light passes through the filter plate and is detected by the second polarizing filter.

Conventional liquid crystal displays such as amorphous TFT and super-twist nematic (STN) displays employ large external drive circuitry. However, the amorphous silicon transistors of conventional liquid crystal displays lack the electron mobility and leakage current characteristics necessary for micro liquid crystal displays. Moreover, size and cost restraints for micro liquid crystal displays generally require the drive circuitry of an integrated circuit to be integrated into the display along with the pixel transistors. Because the drive circuitry must be fabricated on the display substrate, micro displays are generally limited to high quality transistor technology such as single crystal (x—Si) and polysilicon (p—Si).

Micro display technologies can roughly be divided into two types: transmissive and reflective. Transmissive micro displays include polysilicon TFT displays. Polysilicon TFT displays dominate display technology in high-end projection systems and are also used as viewfinder displays in hand-held video cameras. They are usually based on twisted nematic (TN) construction. See U.S. Pat. No. 5,327,269 entitled *Fast Switching 270 Degree Twisted Nematic Liquid Crystal Device and Eyewear Incorporating the Device* and invented by an inventor of the below described invention.

The aperture ratio of a transmissive micro display is obtained by dividing the transmissive area by the total pixel area. High-resolution polysilicon displays such as Super Video Graphics Array (SVGA) are limited to what is considered larger micro displays having 0.9–1.8 inch diagonal (22.9–45.7 millimeter diagonal). This is because the area required by the pixel transistors and the addressing lines reduces the aperture ratio. Aperture ratios for polysilicon displays are usually around 50%. Single crystal silicon transmissive displays are similar to polysilicon TFT displays but use a transistor lift-off process to obtain single crystal silicon transistors on a transparent substrate. These displays are often referred to as Liquid Crystal on Silicon (LCOS) displays when a liquid crystal is used as the light modulator in the display.

Reflective micro displays are usually based on single-crystal silicon integrated circuit substrates with a reflective aluminum pixel forming a pixel mirror. Because it is reflective, the pixel mirror can be fabricated over the pixel transistors and addressing lines. This results in an aperture ratio (reflective area/absorptive area) that is much larger than polysilicon displays. Aperture ratios for reflective displays can be greater than 90%. Because of the large aperture ratio and the high quality silicon transistors, the resolution of a reflective micro display can be very high within a viewing area that is quite small.

There are several different liquid crystal technologies currently used in reflective micro displays. These include ferroelectric liquid crystal (FLC), polymer disbursed liquid crystal (PDLC), and nematic liquid crystal. Size and resolution of reflective micro displays may range from 0.25 inch diagonal (QVGA) to 0.9 inch diagonal (SXGA) (6.4–22.9 millimeter diagonal). Reflective micro displays are limited in physical size because as the size increases the cost increases and yield decreases.

Another aspect of liquid crystal display technology is the methodology used in their fabrication. One liquid crystal display invention has as an element an optically transmissive first substrate that may be positioned to receive light incident from the light source. The fabrication process of this particular invention teaches positioning a reflective second substrate adjacent to the first substrate. The second substrate has as active area that may include a circuit panel and a perimeter seal area surrounding that active area. To separate the first substrate from the second substrate, spacers are configured about the perimeter seal area of the second substrate. Between the first substrate and the second substrate is a liquid crystal material. In practice, the process results in individual integrated circuits, which are then laminated with a retarder and covered with a protective glass sheet. The problem with this method is that the retarder often-gets scratched with a production unit so small.

For further background in this area, see Douglas J. McKnight, et al., 256×256 *Liquid-Crystal-on-Silicon Spatial Light Modulator*, 33 Applied Optics No. 14 at 2775–2784 (May 10, 1994); and Douglas J. McKnight et al., *Development of a Spatial Light Modulator: A Randomly Addressed Liquid-Crystal-Over-Nmos Array*, 28 Applied Optics No. 22 (November 1989).

SUMMARY OF THE INVENTION

The invention is a method for fabricating a light modulation system on a semiconductor substrate containing a plurality of integrated circuits. The invention is to apply the optical element layer (or a plurality of layers) at the wafer sandwich level, unlike what has been done previously, applying the optical element layer onto the individual integrated circuits. The invention takes the silicon wafer sandwich and cuts partway through the glass side. The glass layer has a transparent electrode in it. Once back in the clean room, the surface is cleaned and the retarder film is laminated on. The retarder has an adhesive (PSA) only on one side. The PSA adhesive is also laminated onto a separate piece of thin glass. The retarder with the PSA layer is laminated onto the sandwich. The thin glass with the PSA layer is brought together adhering the glass on top of the retarder. The top glass is cut through, just barely tickling the retarder. The blades are changed and the retarder is cut through. The assembly is then turned over after cutting reference flats after a correct alignment and the silicon is partway cut through. The displays are snapped apart, yielding individual integrated circuits that already have the optical element (retarder) laminated onto them, and are capable of creating separate display devices.

An alternate embodiment of the invention teaches a method by which a prefabricated top glass/PSA/retarder/PSA assembly is laminated onto the silicon wafer sandwich, thereby eliminating the operations involved in the preparation of the retarder and glass surface.

Although the present invention is described in terms of a preferred embodiment, it may be used in the fabrication of transmissive displays, reflective display systems, and emissive displays.

BRIEF DESCRIPTION OF THE DRAWINGS

FIG. 5 shows a cylinder having a velvet cloth on its surface;

DETAILED DESCRIPTION OF THE INVENTION

In the following description, numerous specific details are set forth such as specific materials, processing steps, processing parameters, etc., in order to provide a thorough understanding of the invention. One skilled in the art will recognize that these details need not be specifically adhered to practice the claimed invention. In other instances, well known processing steps, materials, etc., are not set forth in order not to obscure the invention. As indicated under MPEP 2164.01, a patent need not teach, and preferably omits, what is well known in the art.

Figure 1:
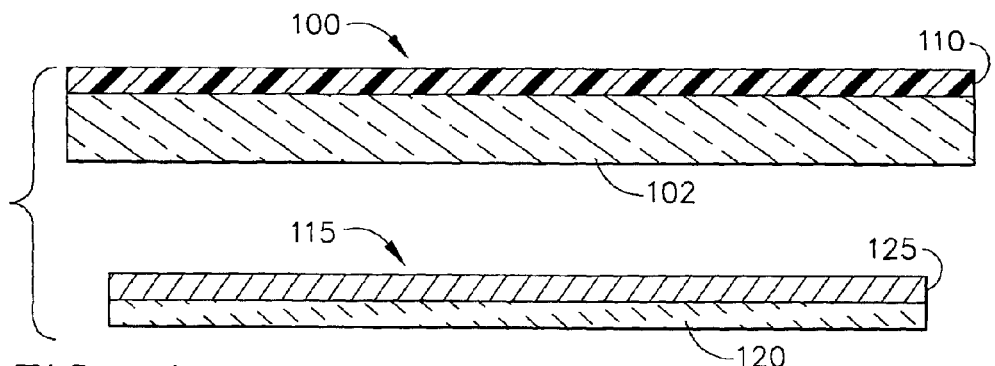
FIG. 1 shows a planar side view of an optically transmissive substrate and a semiconductor substrate or wafer.
Figure 18:
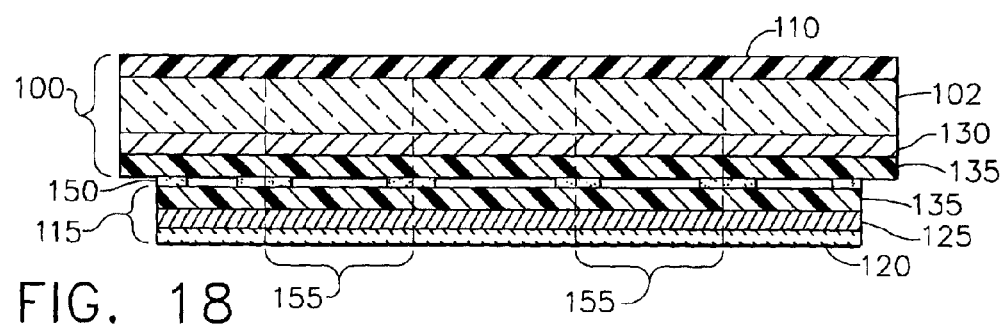
FIG. 18 illustrates a compensating or retarder film laminated to the entire surface of the transmissive substrate.

The following describes an embodiment of forming a liquid crystal display, cell, or device, in accordance with the invention. FIG. 1 shows a planar side view of optically transmissive substrate 100 and semiconductor substrate or wafer 115. In this embodiment, the character of substrate 100 is optically transmissive where optically transmissive substrate 100 may serve as a cover that is positioned to receive light incident from a light source (not shown). Moreover, optically transmissive substrate 100 may be approximately 1.1 millimeters (mm) thick. Optically transmissive substrate 100 may include cover glass material 102, such as Corning 1737 industrial grade boroaluminosilicate glass available from Applied Films Corporation of Boulder, Colo. With the processing temperature ranges for making liquid crystal displays being between 0 degrees Celsius (degs. C.) and 300 degs. C., Corning 1737 is a preferable glass material because it is readily availability and its coefficient of thermal expansion (Corning 1737 CTE=37.6× $10^{-7}$/deg. C.) is very close to that of silicon. In this embodiment, optically transmissive substrate 100 may include a film of retarder layer 110 laminated to glass material 102 as seen in FIG. 1 and FIG. 18. Retarder layer 110 serves to compensate for residual birefringence in liquid crystal during the "on" (black) state. Retarder layer 110 improves the contrast of the display.

FIG. 1 also shows semiconductor wafer 115 that contains, for example, a plurality of flat-panel display circuitry. The circuitry preferably is based on single-crystal silicon integrated circuit substrate technology with a reflective pixel layer. In the embodiment shown, the individual display circuitry of wafer 115 is, for example, reflection mode circuitry. This reflection is illustrated in FIG. 1 by reflective pixel layer 125. Reflective pixel layer 125 is fabricated preferably out of aluminum over the circuitry having pixel transistors and addressing lines within backplane 120 of wafer 115. In this embodiment, the aluminum provides a reflective character to pixel layer 125. Other materials such as gold or silver that are capable of reflecting sufficient undiffused light to form a virtual image so as to faithfully reflect or give a true picture may be used. It is to be appreciated that the invention is not limited to semiconductor wafer arrays. Other substrate arrays such as, for example, silicon on insulator (SOI) arrays, can also be used to form the individual display devices of the invention.

Figure 2:
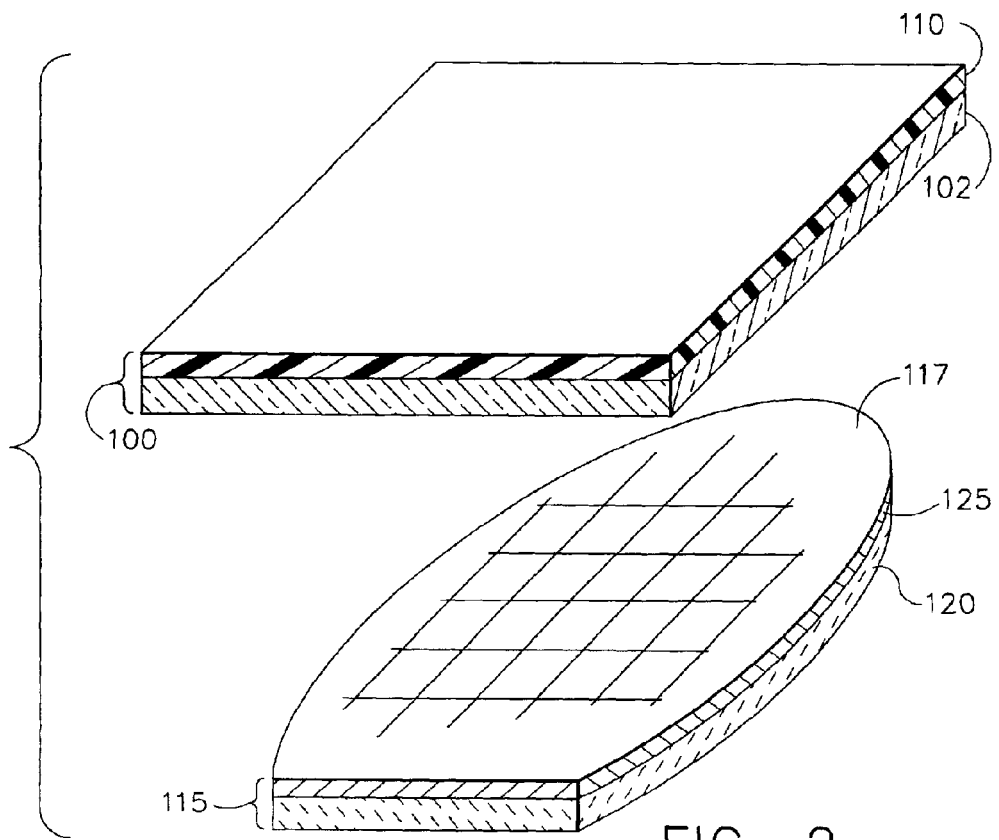
FIG. 2 is a perspective top view of the substrates of FIG. 1.

FIG. 2 is a perspective top view of the substrates of FIG. 1. FIG. 2 shows cover glass 102 situated above circuitry pattern-side 117 of semiconductor wafer 115. Wafer 115 is shown with reflective pixel layer 125 over a plurality of reflection mode display circuitry revealed on pattern-side 117 of backplane 120.

Figure 3:
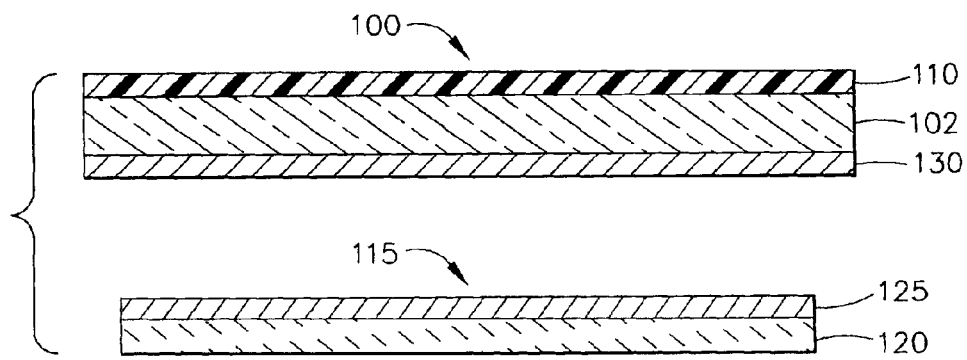
FIG. 3 is a planar side view of the substrate and wafer after the subsequent processing step of depositing a conductive coating on an optically transmissive substrate.

FIG. 3 is a planar side view of substrate 100 and wafer 115 after the subsequent processing step of depositing conductive coating 130 on optically transmissive substrate 100. In one embodiment, optically transmissive substrate 100 is glass material 102 made of Corning 1737 glass having conductive coating 130 of Indium-Tin-Oxide (ITO) applied to one side. ITO is a transparent metal oxide coating that may be deposited on glass material 102 by way of a sputtering operation. ITO is an industry standard conductive film because of its high optical transmission and low electrical resistance. The ITO may be combined in multiple layers with other optical films, such as silicon dioxide, to reduce internal reflections in the liquid crystal display. U.S. Pat. Nos. 5,230,771, 5,171,401, and 5,032,221 were co-invented by an inventor of this patent and relate to plasma etching of Indium Tin Oxide.

In this embodiment, conductive coating 130, such as ITO layer, is not patterned. It has been found that depositing conductive coating 130 without patterning, simplifies the manufacturing process because it eliminates the need for photolithography processing. Importantly, un-patterned cover glass substrate 100 also simplifies the assembly process because it allows for a simple mechanical alignment of substrate 100 and wafer 115 rather than a more complicated camera-assisted alignment as is conventionally employed.

Figure 4:
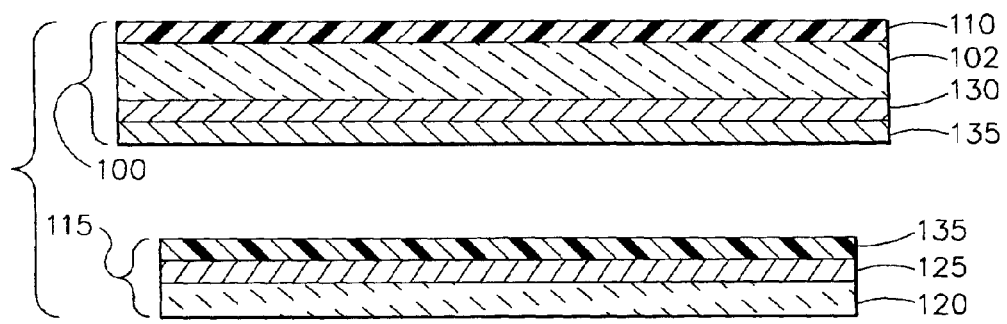
FIG. 4 shows the subsequent processing step of depositing alignment layers on one surface of the substrate and the wafer.

FIG. 4 shows the subsequent processing step of depositing alignment layers 135 on one surface of optically transmissive substrate 100 and on a complementary surface of semiconductor wafer 115. In one embodiment, alignment layer 135 is a polyimide material manufactured by Nissan Chemical Industries of Tokyo, Japan. Polyimide is an industry standard material for nematic liquid crystal alignment layers because of its easy of application, its excellent anchoring of liquid crystal molecules, and its support of a wide range of pre-tilt angles. In one embodiment, alignment layer 135 is NISSAN SE-7492™ polyimide material purchased as a solution to be spin-coated on substrate 100 and substrate 115. In this embodiment, the polyimide initially has a 6% solids content. Prior to deposition onto optically transmissive substrate 100, the polyimide is diluted with Nissan Solvent 21 (or Nissan Solvent 2M) to a 2% solid solution. NISSAN SE-7210™ may also be used for alignment layer 135.

In the application of alignment layer 135, optically transmissive substrate 100 and semiconductor wafer substrate 115 are spun-coated with a 2% solids polyimide solution. Spin coating is a method of film deposition that provides a uniform coating across the surface of the substrate. Spin coating equipment is widely used in the display processing industries.

After substrate 100 and wafer 115 are coated with alignment layers 135, the polyimides of alignment layers 135 are cured. The substrates first receive a low temperature soft bake (e.g., 80 deg. C. on metal surface in convection oven) to remove the solvents, then a high temperature hard bake (e.g., ramp from 80 deg. C. to 240 deg. C. in 30 minutes; total hard bake cycle time 90 minutes) to fully cure the polyimide. The cure processes of the invention preferably are performed in a clean room convection oven.

One purpose of alignment layers 135 is to establish the optical reference axis of the liquid crystal material. Once alignment layers 135 are deposited and cured on substrate 100 and wafer 115, alignment layers 135 may be aligned in accordance with the desired light rotation of the liquid crystal material molecules that will form part of the individual display. The alignment direction of the liquid crystal molecules is obtained by means of rubbing the exposed surface of alignment layers 135 with a velvet cloth.

Figure 5:
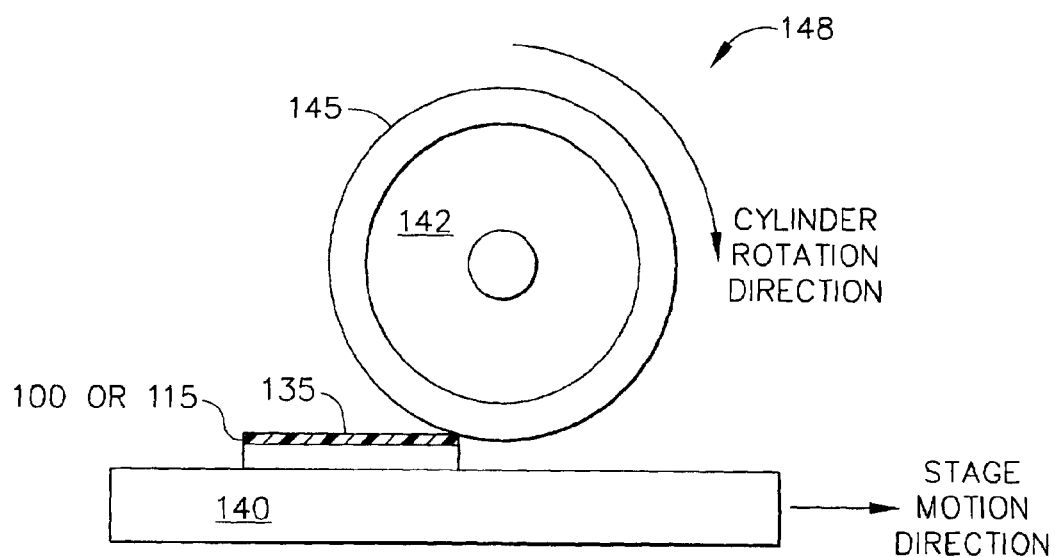
FIG. 5 schematically illustrates an apparatus for rubbing the surface of the alignment layers with a velvet cloth.

FIG. 5 schematically illustrates apparatus 148 for rubbing the surface of alignment layer 135 with velvet cloth 145. As a soft fabric, such as silk, rayon, or nylon, velvet is preferred to impart the alignment direction because of its smooth, dense pile and a plain underside. FIG. 5 shows a cylinder 142 having velvet cloth 145 on its surface. Cylinder 142 rotates, in this case, in a clockwise direction. Substrate 100 or 115 having alignment layer 135 rests on a horizontally moving stage 140 so that alignment layer 135 of substrate 100 or 115 comes in contact with velvet cloth 145 of cylinder 142. In one embodiment, cylinder 142 rotates at a speed of 400 revolutions per minute. Stage 140 moves in a horizontal direction at a speed of approximately 0.75 inches per second yielding a table stage motion axis relative to cylinder rotation axis of 90 degrees and rub depth of 0.007 to 0.020 inches. A suitable material for cloth 145 may be, for example, the YA-20-R rayon cloth produced by Yoshikawa Chemical Company of Tokyo, Japan.

Figure 6:
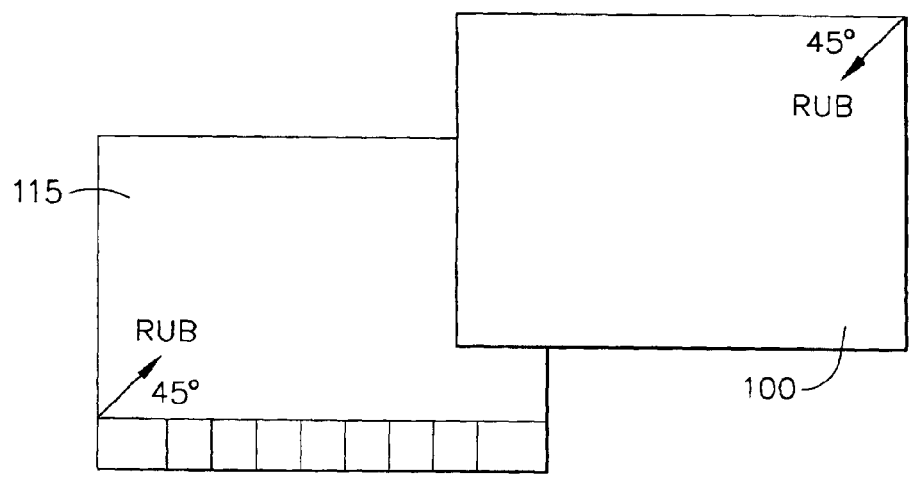
FIG. 6 shows exemplary rub directions for opposing alignment layers of a substrate and a wafer 115.

FIG. 6 shows exemplary rub directions for opposing alignment layers 135 of substrate 100 and wafer 115 as imparted via apparatus 148 of FIG. 5. It is to be appreciated that the depth and direction of the rub is a function of, for example, the liquid crystal molecules chosen for the individual display. The above description of the rub process of alignment layers 135 is presented in detail herein by way of explanation and not by way of limitation, in accordance with the description of the particular liquid crystal display described herein.

Once alignment layers 135 are deposited on substrate 100 and 115 and rub directions are established on alignment layers 135, spacers are applied to semiconductor wafer 115. As described in connection with FIG. 7, one purpose of applying spacers is to create cell gap 207 (FIG. 11) for the placement of liquid crystal molecules between substrate 100 and substrate 115.

Spacers may be dispersed randomly across the entire display substrate, including the viewing area. In some displays, for example, the spacers in the viewing area maintain spacing uniformity because glass substrates overlying display circuitry can warp.

Figure 7:
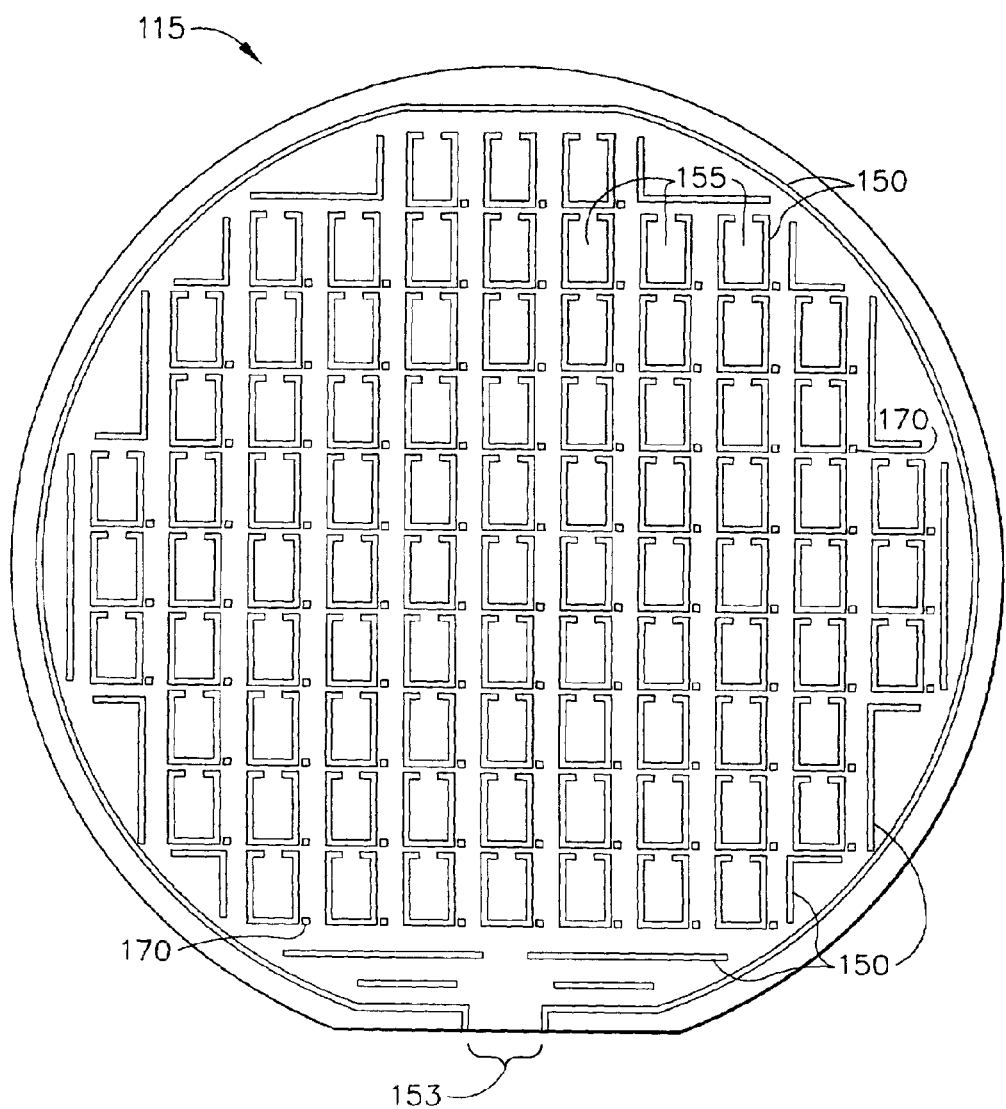
FIG. 7 schematically illustrates a planar top view of a wafer including a plurality of micro display areas.

FIG. 7 schematically illustrates a planar top view of wafer 115 including a plurality of micro display areas 155. In one embodiment, there are 86 micro display areas 155. FIG. 7 shows a perimeter seal material 150 containing spacers 152 (FIG. 8) surrounding the perimeter of each of a plurality of display area 155 as well as surrounding the inside perimeter of wafer 115. Spacers may also be applied randomly across the entire substrate using a spray-on method. Perimeter seal material 150 may be a thermal cure adhesive as discussed below and spacers 152 may be silica spheres.

Material 150 preferably comprises white silica spheres initially in a dry state. To form perimeter seal material 150, 0.10 grams of this dry spacer material is mixed with 20 grams of perimeter seal material. In this embodiment, perimeter seal material 150 is a heat-cured adhesive, such as Mitsui Chemicals XN-651. It is to be appreciated that there are many suitable adhesives including, but not limited to, heat- and ultraviolet-cured adhesives.

Perimeter seal material 150 containing spacers 152 may be applied using a syringe having a fluid dispensing system, such as one manufactured by the Camalot Division of Speedline Technologies. An automatic dispensing system may consist of a syringe mounted above wafer substrate 115 having full X- and Y-motion capabilities. Perimeter seal material 150 including spacers 152 may then be dispensed from a needle.

Figure 8:
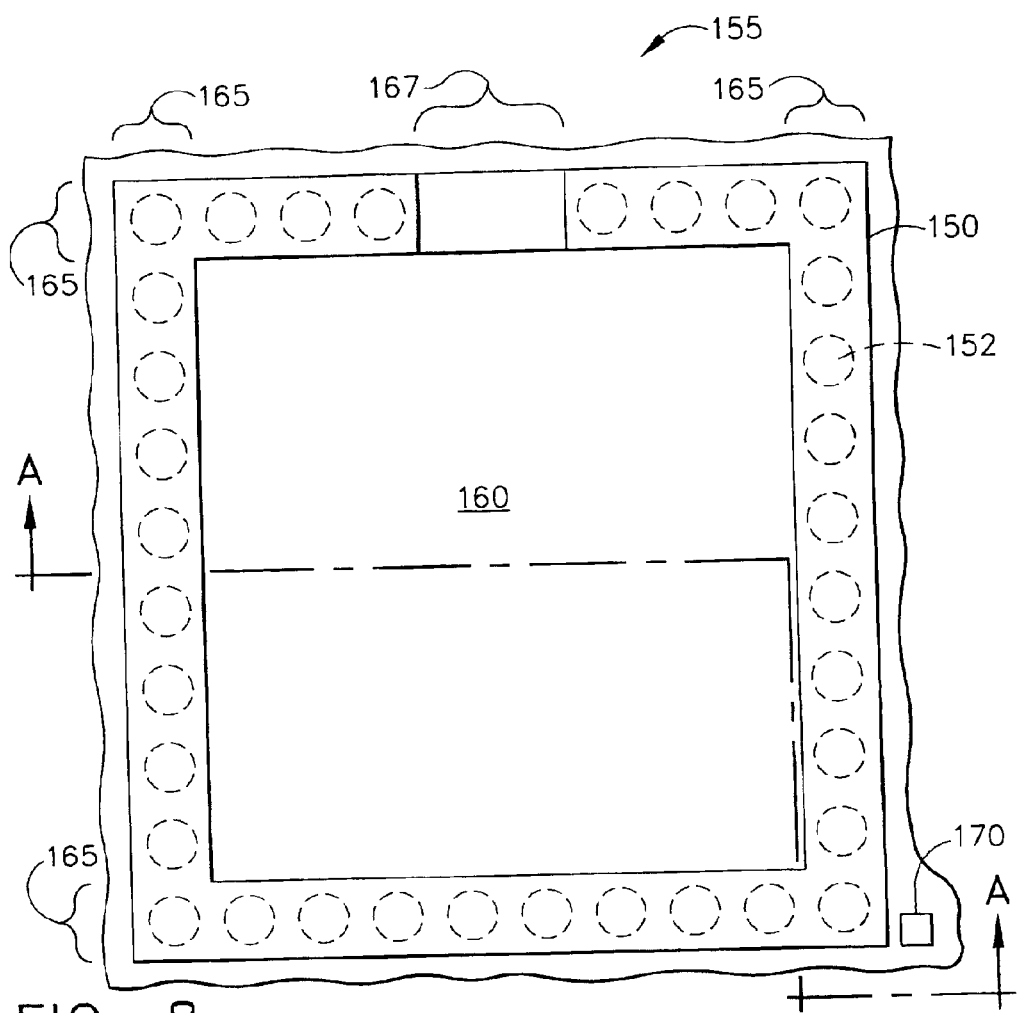
FIG. 8 illustrates one micro display area of the semiconductor wafer.

Perimeter seal material 150 containing spacers 152 are dispensed in the perimeter seal areas 165 as shown in FIG. 8. As shown in FIG. 7, a pattern (perimeter seal material 150 encapsulating spacers 152) is also dispensed at the edge of wafer 115 in the "unused" areas of wafer 115. This additional edge pattern is a support structure that works to prevent wafer 115 from collapsing at its edges. Without this support structure around the edge of wafer 115, wafer 115 cannot adequately support the force required to press together wafer 115 and optically transmissive substrate 100. Without sufficient press force, a non-uniform cell gap 207 that is collapsed at the edge of wafer 115 will be formed. The perimeter seal around the outer edge of wafer 115 also works as a seal to prevent water from entering the cell gap during a wafer dicing process.

The next step in forming a LCD display in accordance with an embodiment of the invention is the deposition of a crossover material on each display area 155 of wafer 115. Recall that when a magnetic or electrical field is applied normal to the liquid crystal material, the liquid crystal material forms a localized monocrystal that is polar in character. A cross-over may be thought of as an adhesive material or epoxy into which conductive material is disbursed so as to aid in creating an electrical path between the reflection mode display circuitry that resides below the reflective pixel layer of the wafer and the conductive coating layer attached to the glass cover. In other words, crossover material 170 communicates the cover glass drive voltage from reflective pixel layer 125 of wafer 115 to conductive coating 130 of substrate 100. Conventionally, the cross-over material is made of silver particles or gold-coated plastic particles.

To conventionally create this electrical path, alignment layers 135 are first removed or etched away to create a path in reflective pixel layer 125 and in conductive coating 130. Then, the crossover material is adhered to this path in reflective pixel layer 125 and brought into contact with the path in conductive coating 130. Alternatively, a special mask conventionally is created to mask off the crossover paths prior to applying the polyimide.

In an embodiment of the invention, crossover material 170 preferably contains particles made of conductive nickel. The nickel particles surprisingly permit crossover material 170 to break through the polyimide alignment layers 135 to create the desired electrical path. Thus, the use of nickel particles eliminates the need to etch away alignment layers 135 or use a mask prior to applying alignment layers 135.

To form an embodiment of crossover material 170, nickel particles having 2.0 micron nominal diameters are first mixed with a solvent, for example isopropyl alcohol, in a concentration of approximately 1.0 gram of cross-over material to 3 grams of solvent. The materials are mixed in a container and sealed. The mixture is then placed in an ultrasonic bath for fifteen minutes to thoroughly mix the particles in the solvent and to-break up any clumps of material. The solvent is then evaporated and nickel particles are then mixed with 32 grams of perimeter seal material. Similar to perimeter seal material 150, a Camalot fluid dispensing machine may be used to dispense cross-over material 170. In one embodiment, the machine includes a dispensing needle size of approximately 0.006 inches inside diameter, a needle height of 0.002 inches, and a dispensing pressure of 28 pounds per square inch.

Once cross-over material 170 is placed on the individual display area 155 of wafer 115, wafer 115 and optically transmissive substrate 100 are assembled together. In one embodiment, wafer 115 is placed on a metal surface in a pre-heated convection oven and baked at 85 deg. C. for approximately 30 minutes as a pre-cure. This pre-cure bake evaporates solvents in perimeter seal material 150. Wafer 115 is then placed on a vacuum chuck. Then, optically transmissive substrate 100 is placed over wafer 115 and tacked onto wafer 115.

Figure 10:
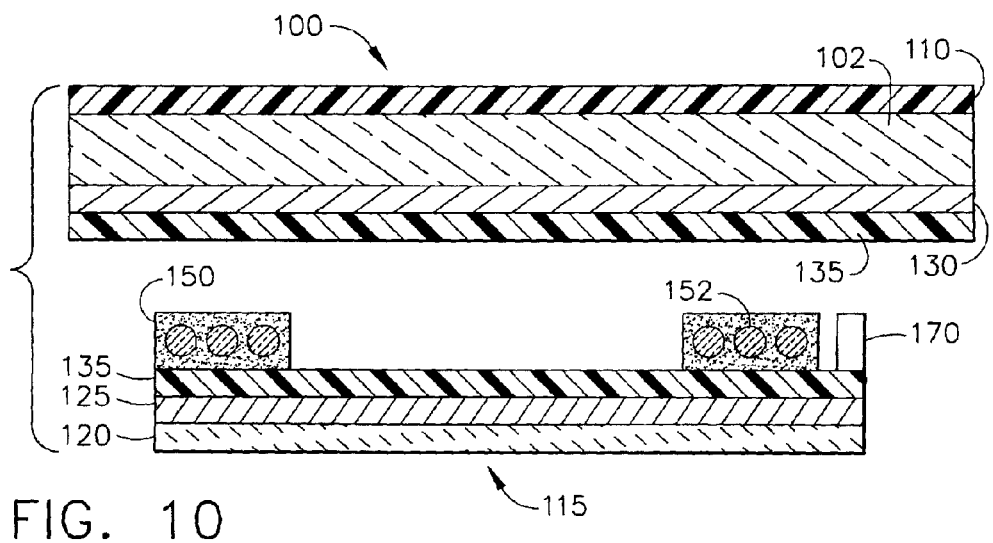
FIG. 10 shows the wafer after the deposition of crossover material.

FIG. 8 illustrates one micro display area 155 of semiconductor wafer.115. Display area 155 may include a viewing area 160 and a perimeter seal area 165. Perimeter seal area 165 includes a plurality of spacers 152 in perimeter seal adhesive 150. FIG. 8 shows that the spacers 152 and perimeter seal adhesive 150 are disbursed generally throughout perimeter seal area 165. One exception is fill port area 167 of perimeter seal area 165. Area 167 is left free of perimeter seal material 150 and spacers 152 to allow a path for the placement of liquid crystal display material (material 220, FIG. 16; material 310, FIG. 30; and material 311, FIG. 32) into display area 160. As shown in FIG. 10, the matrix of spacers 152 may include more than one spacer 152 across area 165.

Figure 15:
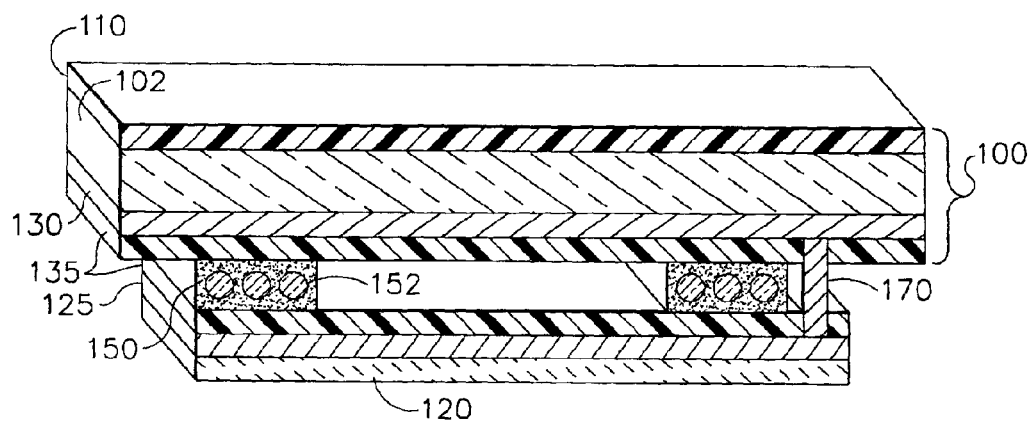
FIG. 15 illustrates how the gap may also be used as an entrance for liquid crystal display material.

Spacers 152 such as shown in FIG. 8 are added to perimeter seal area 165 to create cell gap 207 (FIG. 11) between wafer 115 and optically transmissive substrate 100. Cell gap 207 is created to permit placement of liquid crystal material between wafer 115 and optically transmissive substrate 100. Perimeter seal material 150 seals the gap between wafer 115 and substrate 100 along the pattern of perimeter seal area 165 to capture liquid crystal material within each viewing area 160. Similar to fill port area 167 of FIG. 8, gap 153 of FIG. 7 is left free of perimeter seal material 150 and spacers 152. This permits trapped air to escape as wafer 115 is affixed to optically transmissive substrate 100. Gap 153 may also be used as an entrance for liquid crystal display material 220 (FIG. 15).

Figure 9:
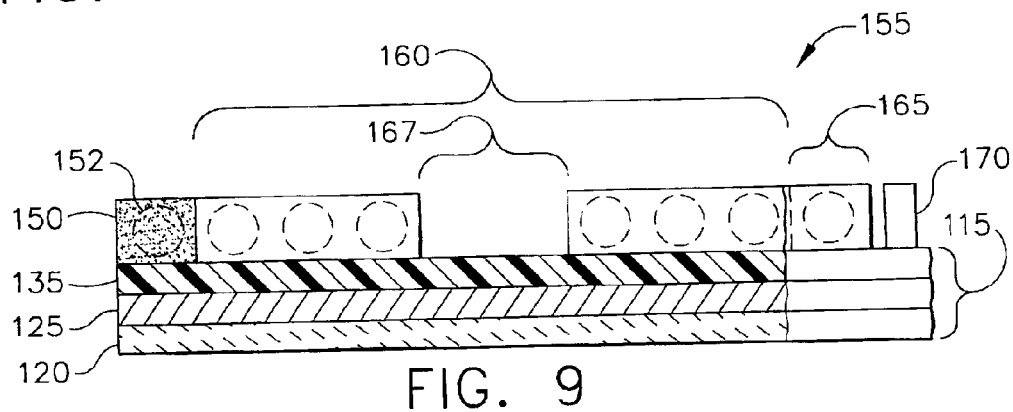
FIG. 9 shows a cross section of a-display area taken through line A—A of FIG. 8.

FIG. 9 shows a cross section of display area 155 taken through line A—A of FIG. 8. FIG. 9 shows display area 155, display area 160, perimeter seal area 165, cross-over material 170, and spacers 152. The outside diameter of spacers 152 is a function of the desired thickness of the liquid crystal material layer, such as cell gap 207 of FIG. 11. In one embodiment, spacers 152 may be 2.1 micron silica spheres from Bangs Laboratories of Fishers, Indiana. Spacers having an outside diameter ranging from 1.5–3.0 microns are used in this embodiment. Spacers 152 are mixed with perimeter seal material where the mixture is applied to perimeter seal area 165 of display area 155 of wafer 115 and to the inside perimeter of wafer 115 (FIG. 7) during a perimeter seal application process.

As noted above, gap 153 of FIG. 7 is left in the wafer perimeter seal to allow air to escape during a subsequent press and cure process. Gap 153 also permits the positioning of liquid crystal material between wafer 115 and optically transmissive substrate 100 prior to dicing or "singulating" wafer substrate 115. Gap 153 is later filled with an adhesive to complete display area 160.

Figure 34:
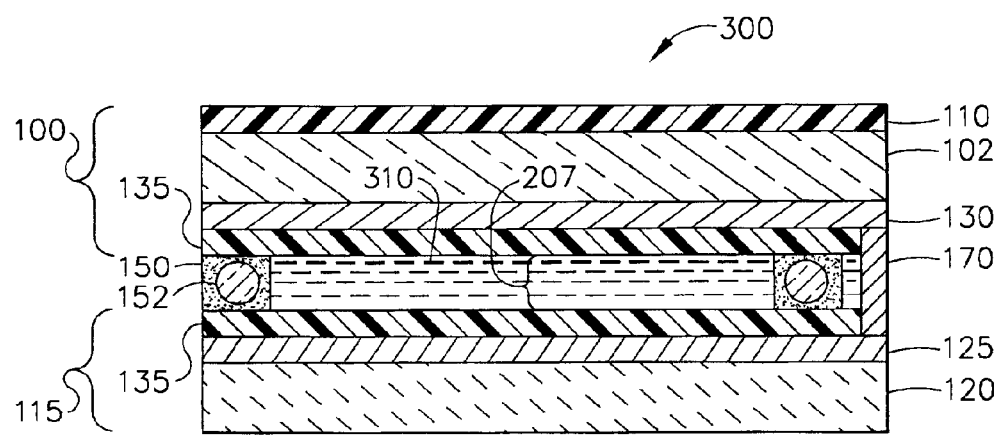
FIG. 34 illustrates a cross-section of an individual display from an X-direction.
Figure 35:
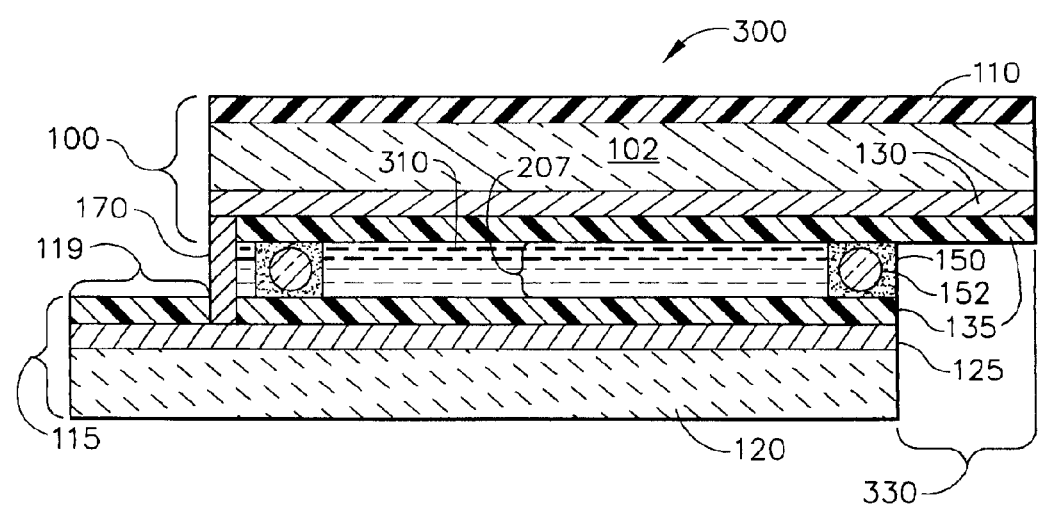
FIG. 35 illustrates a cross-section of an individual display from a Y-direction.

FIG. 10 shows wafer 115 after the deposition of crossover material 170. Cross-over material 170 provides, in one manner, electrical contact between wafer 115 and optically transmissive substrate 100, such as seen in FIG. 34 and FIG. 35. In the embodiment where spacers 152 have an outside diameter of 2.1 microns, cross-over material 170 preferably contains 2.0 micron nominal diameter nickel particles purchased from Goodfellow, Inc. of Cambridge, England. Other conductive particles are acceptable substitutes for nickel where supplied in a particle form having similar conductive characteristics and break-through characteristics as nickel. In this embodiment, because conductive coating 130 of transmissive substrate 100 has no patterning, a mechanical alignment method can be used during assembly as shown in FIG. 10.

Figure 11:
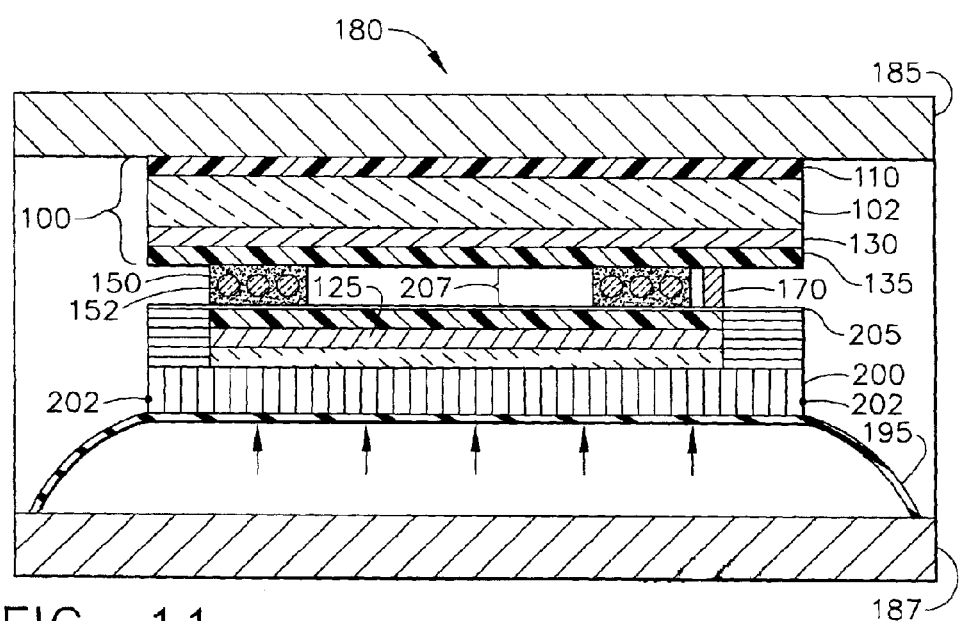
FIG. 11 shows an optically transmissive substrate and a wafer assembled together in a mechanical press.

Once optically transmissive substrate 100 and wafer 115 are assembled together, the substrates may be placed in mechanical press 180 as shown in FIG. 11. Mechanical press 180 consists of two heated aluminum plates 185 and 187 hinged together in a clamshell fashion wherein each shell is parallel to one another. In this embodiment, bottom plate 187 includes an inflatable bladder 195. Inflatable bladder 195 provides the direct pressure required to assemble together transmissive substrate 100 and wafer 115.

Figure 13:
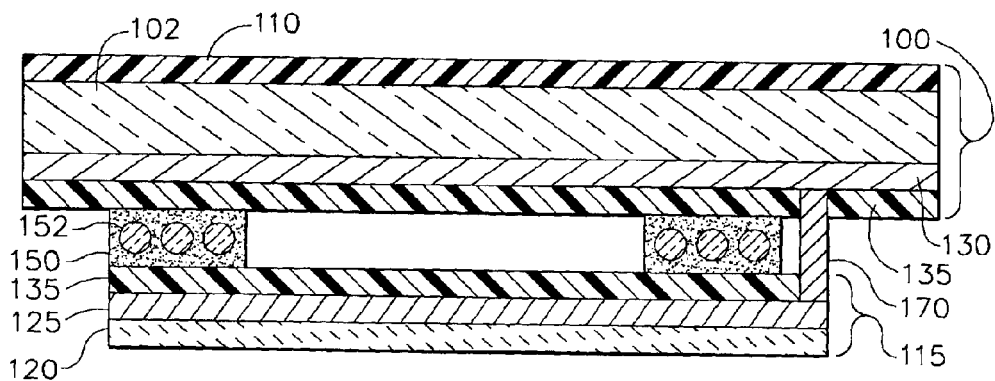
FIG. 13 illustrates the crossover material piercing the alignment layers.

Wafer 115 and substrate 100 are pressed together in such a manner that cross-over material 170 pierces each alignment layer 135 to make contact between conductive coating 130 and reflective pixel layer 125 as seen in FIG. 13. In one embodiment, wafer 115 and substrate 100 are pressed together so that they are separated by a distance of approximately 2 microns at cell gap 207.

Figure 12:
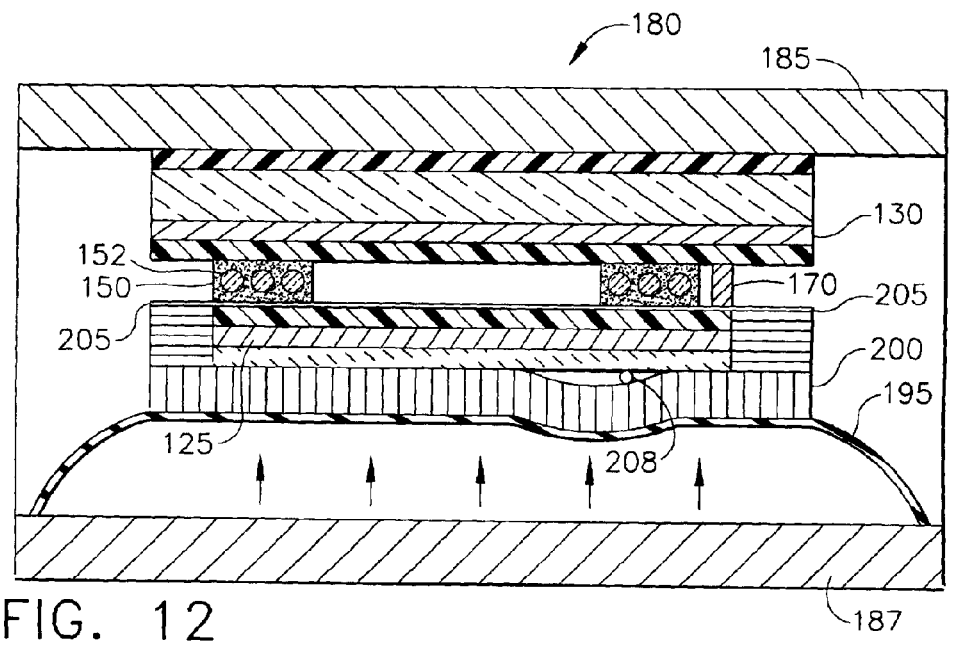
FIG. 12 shows that a shim plate is flexible enough to conform to the presence of foreign particles.
Figure 14:
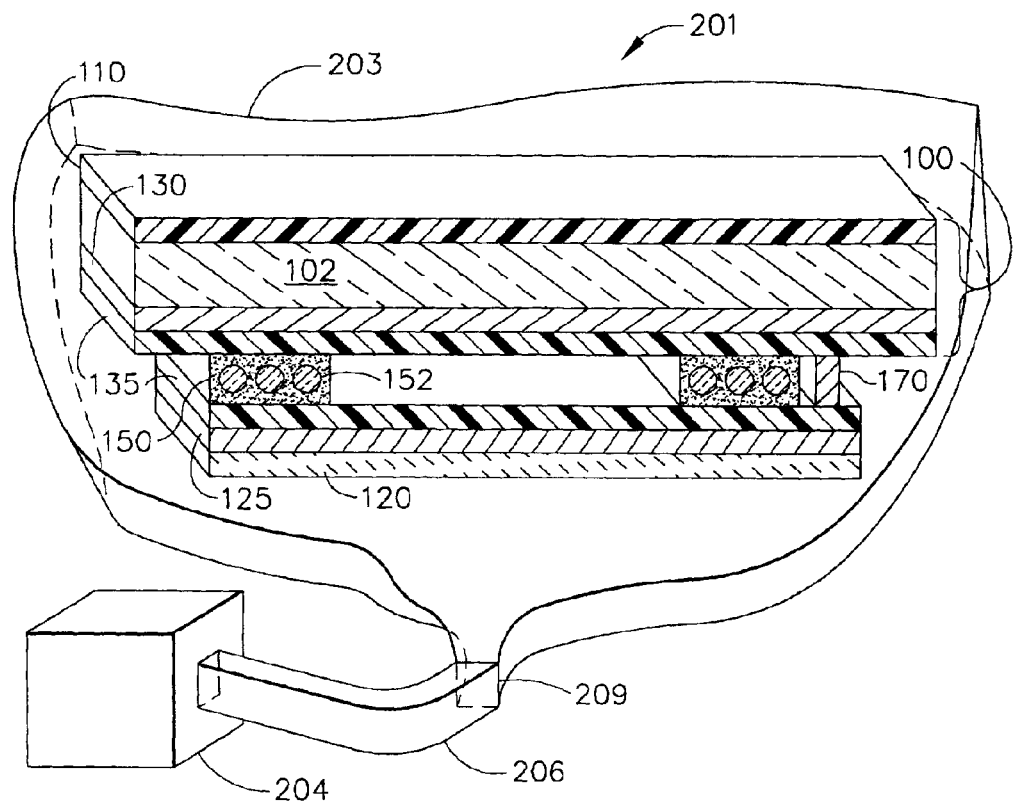
FIG. 14 illustrates the use of a conformal bag press.

A preferred alternate embodiment to the press assembly technique of FIG. 11 and FIG. 12 will now be described. FIG. 14 illustrates the use of conformal bag press 201. Once optically transmissive substrate 100 and wafer 115 are assembled together as shown in FIG. 10, the assembly may be placed in conformal bag 203 of bag press 201 as shown in FIG. 14. Conformal bag 203 may be a rectangular shaped, high temperature nylon bag. At this point, tube 206 extending from vacuum pump 204 is coupled to bag end 209 of conformal bag 203. Vacuum pump 204 may be a food industry, commercial quality sealer.

With vacuum pump 204 activated, air is drawn from the inside of conformal bag 203. As air is drawn from the inside of conformal bag 203, conformal bag 203 closes about substrate 100 and wafer 115. The compression forces of conformal bag 203 are applied equally about each surface of substrate 100 and wafer 115. Since the force per unit surface area is greatest on the large, exposed surfaces of glass layer and back plane 120, glass layer and back plane 120 move vertically towards one another substantially while maintaining their original, complementary alignment. As the nickel particles within cross-over material 170 are urged into alignment layers 135, the polyimide material of alignment layers 135 separates until cross-over material 170 contacts reflective pixel layer 125 and conductive coating 130. This vacuum bag method is preferred to the clam shell method because, for example, conformal bag 203 easily adjusts to particles trapped between conformal bag 203 and the assembly of substrate 100 and wafer 115.

With a vacuum drawn into sealed, conformal bag 203, conformal bag 203 along with the assembly of substrate 100 and wafer 115 is placed into an oven to cure the adhesive of perimeter seal material 150 and cross-over material 170. Preferably, they remain in the oven at 175 deg. C. for 60 minutes. In an alternate embodiment, the air within conformal bag 203 is evacuated and conformal bag 203 is back filled with another gas, such as nitrogen, helium, or argon, to displace any oxygen. This back filled gas is then evacuated by vacuum pump 204 to compress substrate 100 and wafer 115 together.

Figure 16:
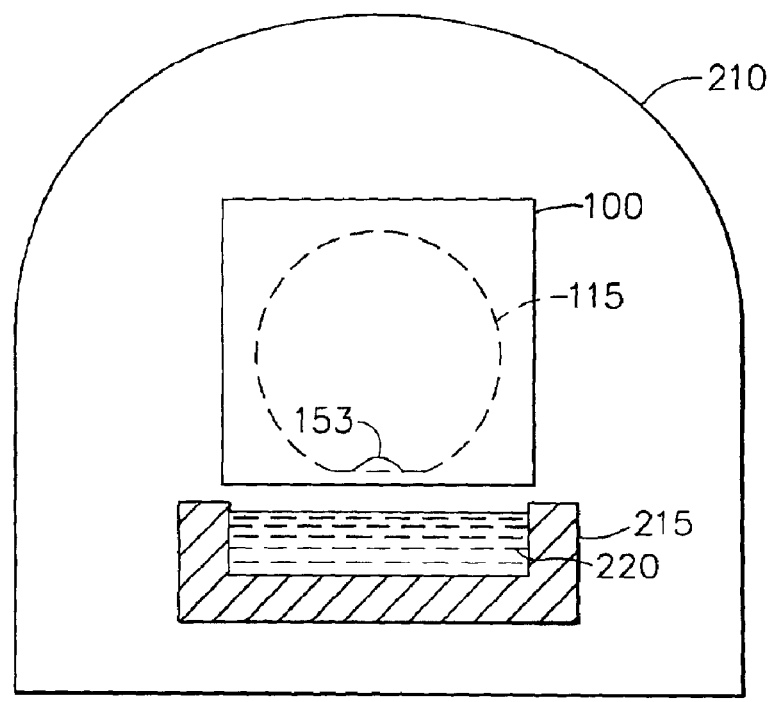
FIG. 16 shows the optically transmissive substrate/wafer assembly lowered into a liquid crystal material bath.
Figure 17:
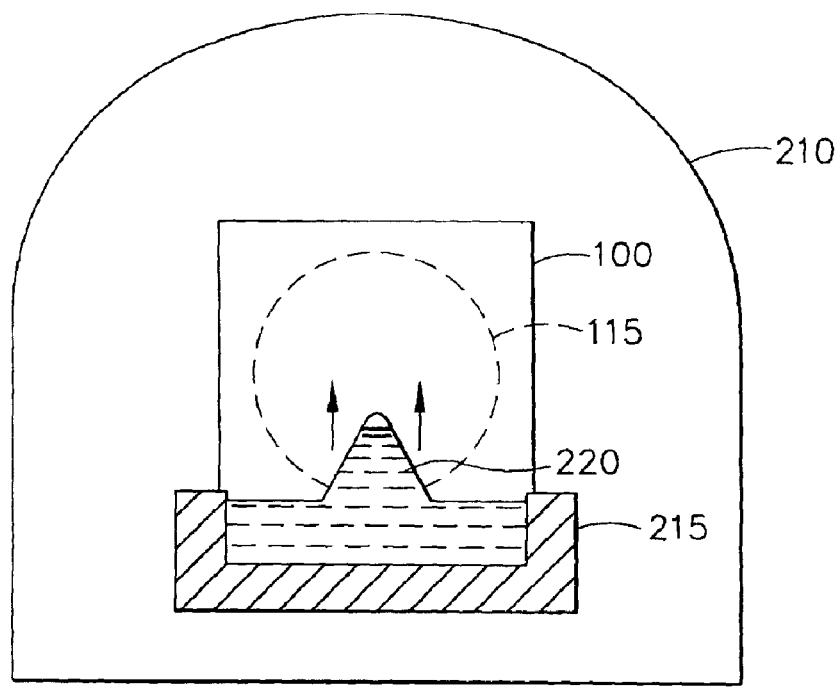
FIG. 17 shows liquid crystal material forced into the cell gap due to pressure differential.

With the adhesives cured and cross-over material 170 in a position to communicate the cover glass drive voltage from reflective pixel layer 125 of wafer 115 to conductive coating 130 of substrate 100, the cell gaps between the individual display area 155 of wafer 115 and optically transmissive substrate 100 may be filled with liquid crystal material before individual display devices 300 (FIG. 28 and FIG. 29) are cut and separated. This filling process is shown in FIG. 16 and FIG. 17. The assembly (optically transmissive substrate 100 and wafer 115) may be filled by a vacuum fill method common to filling nematic liquid crystal displays. The entire assembly is put in a vacuum chamber 210. Chamber 210 is evacuated until the pressure reaches approximately $10^{-1}$ Torr. In connection with FIGS. 7–9, a perimeter seal application process was described for placing perimeter seal material 150 including spacers 152 around wafer 115. As stated, a perimeter seal adhesive 150 is applied around the entire wafer 115 except for evacuation gap port 153 to allow air to escape during the press process. Gap 153 now may be used to allow the entrance of liquid crystal material in the cell gap between the assemblies.

As shown in FIG. 16, the optically transmissive substrate/wafer assembly is lowered into bath 215 containing liquid crystal material 220. The assembly is lowered into the bath 215 until evacuation port 153 contacts liquid crystal bath 215. Chamber 210 is then pressurized to atmospheric pressure with a gas, such as nitrogen, helium, or argon, but preferably air. As illustrated by way of example in FIG. 8, each of individual display area 155 has a fill port 167 to allow liquid crystal material to be placed in display area 160 of individual display device 300. The pressure difference between cell gaps 207 of the individual display devices and the ambient, forces liquid crystal material 220 into cell gaps 207 throughout the assembly as illustrate in FIG. 17. Once liquid crystal material 220 is placed in cell gap 207 of each individual display device 200, the excess liquid crystal material 220 is cleaned off evacuation port area 153. An ultraviolet cure adhesive then is applied to evacuation port 153 and cured with ultraviolet light to seal the assembly.

FIGS. 16 and 17 illustrate a process where liquid crystal material is added to the assembly prior to separating the assembly into individual display devices 300. The liquid crystal material fill process can also be accomplished once the individual displays are separated from the assembly. This is discussed in connection with FIGS. 30 to 33. In this case, evacuation port 153 is filled with an ultraviolet cured adhesive and cured following just after the press process.

To produce high quality static as well as dynamic real time color field images on an active pixel matrix, the nematic liquid crystal material 220 used in a preferred embodiment should meet several factors. Color field sequential operation requires a fast pixel switching time under low voltage operations. Switching speed is proportional to the square of the cell gap. In order to meet the fast switching time required for color field sequential operations, cell gap 207 should be on the order of two microns. This relative thinness is a factor in selecting the proper viscosity for liquid crystal material 220. As another factor, the liquid crystal cell should be capable of rotating the polarization of reflected light by 90 degrees to obtain bright, high contrast operations. Thus, the liquid crystal layer performs as a quarter-wave plate in a preferred embodiment.

The viscosity of liquid crystal material 220 should be as low as possible to achieve fast switching speeds. Moreover, in respect to the above factors, the birefringence (delta n or $\Delta n$) of the liquid crystal material should be approximately 0.1. To achieve low voltage operations, the threshold voltage of liquid crystal material 220 should be low, such as a dielectric constant anisotropy (delta $\epsilon$ or $\Delta \epsilon$) on the order of at least 10. In addition, to avoid undesirable temperature effects at the upper operating range of the micro LCD, the clearing point of liquid crystal material 220 should be at least 20 deg. C. above the highest operating temperatures for the micro LCD. One having ordinary skill in the art of manufacturing liquid crystal material is able to compose a material meeting the above factors for liquid crystal material 220.

After the wafer assembly is pressed and sealed, the exterior surface of optically transmissive substrate 100 is cleaned, for example, with a solvent. If not already applied, an optical film then may be applied to the entire surface of transmissive substrate 100. In one embodiment, compensating or retarder film 110 is laminated to the entire surface of transmissive substrate 100 using a roller-type lamination machine. The lamination is shown in FIG. 18. Compensating or retarder film 110 is used, in one sense, to compensate for unwanted birefringence in a display. The film is used to compensate for residual birefringance in the black state that results in a darker black. Compensating or retarder film thus provides an improved contrast between black and white.

Compensating or retarder film 110 must cover the active area of the display after it is completely assembled. In most display applications that use a compensating or retarder film, the compensating or retarder film is laminated to the individual displays after they are separated from the wafer substrate. This is a labor-intensive process for small displays with many displays on a large substrate. The invention teaches a process in which a film, either retarder or polarizer, is laminated to the glass prior to separating the displays. It is to be appreciated that compensating or retarder film 110 can be laminated to each individual display assembly after they are formed and separated.

Figure 19:
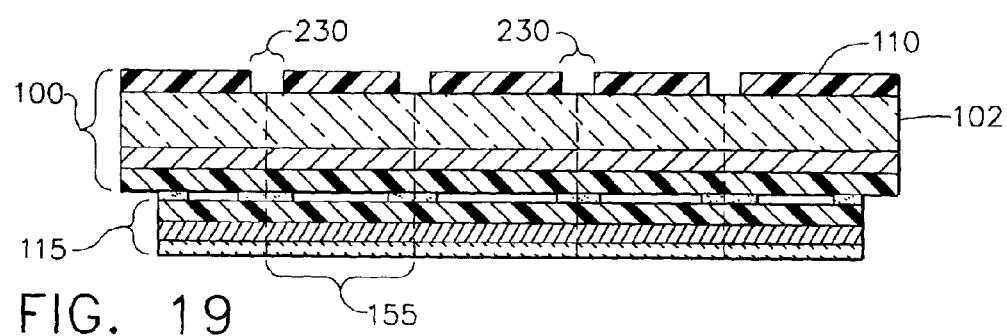
FIG. 19 shows the street areas between the individual display devices.

In street areas 230 between the individual display devices, compensating or retarder film 110 is then removed, using a laser as shown in FIG. 19. This removal exposes transmissive glass material 102 to allow it to be scribed, for example, using a carbide wheel.

Figure 20:
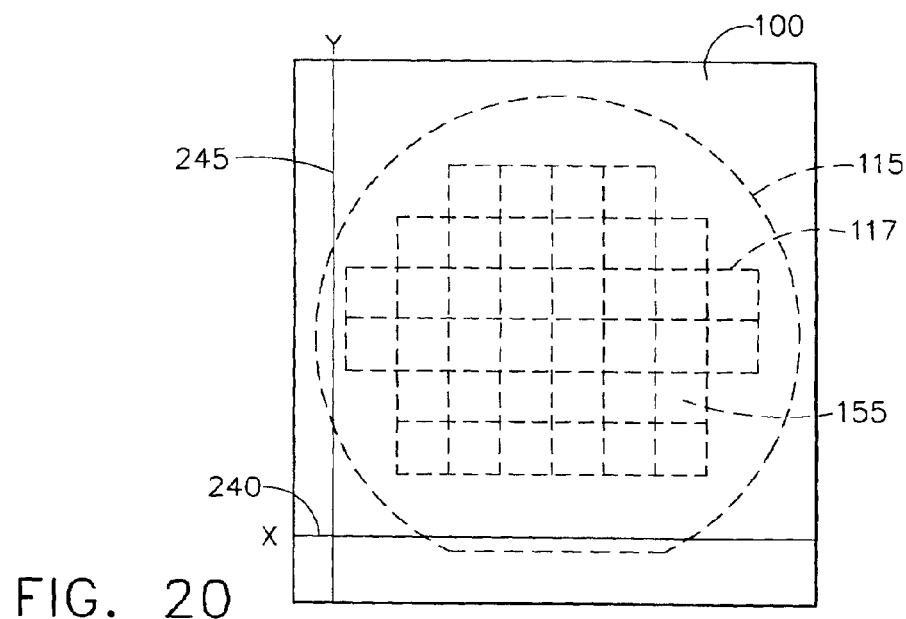
FIG. 20 shows the case where the transmissive substrate is square.

Next, as shown in FIG. 20, in the case where transmissive substrate 100 is square, a dicing saw may be used to scribe relative fiducial or alignment marks 240 and 245 on optically transmissive glass substrate 100. To scribe marks 240 and 245, the assembly is placed on the vacuum chuck of a dicing saw with patterned-side 117 (see FIG. 2) of semiconductor wafer 115 set in the face up position. When the assembly is mounted on the vacuum chuck to cut wafer 115 (i.e., circuitry patterned side 117 of wafer 115 is face down) scribe marks 240 and 245 in transmissive substrate 100 are visible through glass material 102 and may be used for alignment. The camera uses alignment or registration marks 240 and 245 to cut wafer 115 from the backside, since marks 240 and 245 are relative to micro display area 155 of wafer 115.

Figure 21:
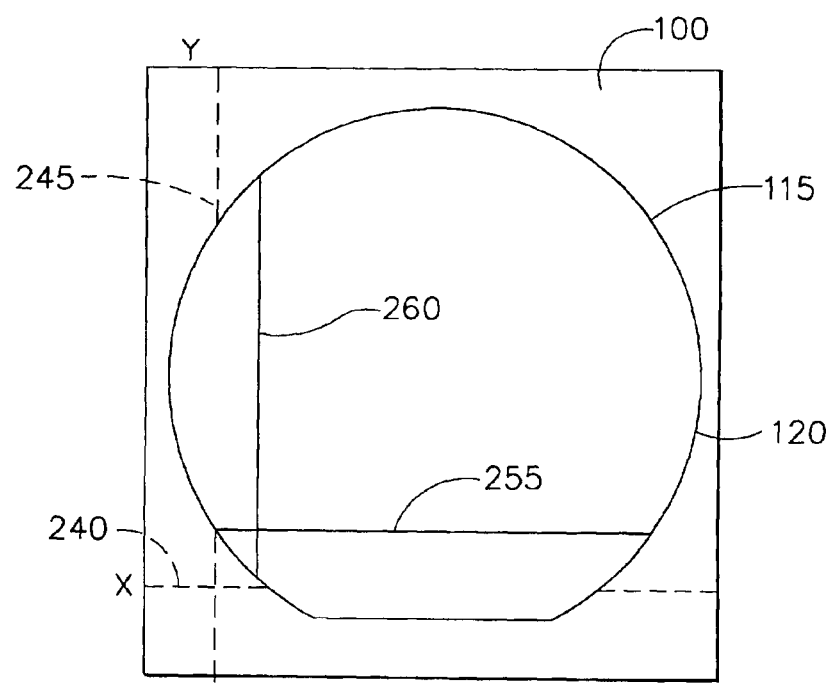
FIG. 21 illustrates how the semiconductor wafer is diced from the backside.
Figure 22:
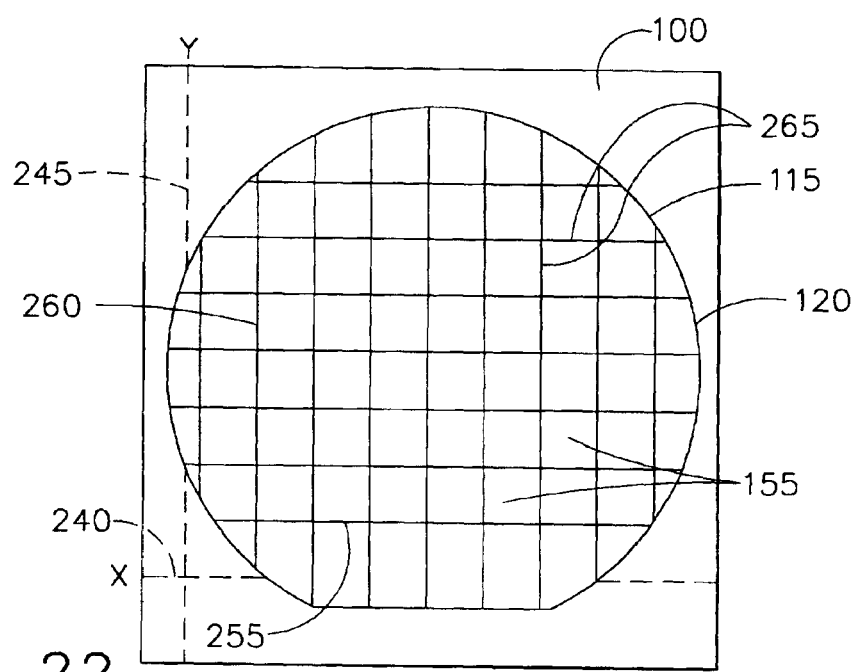
FIG. 22 shows the backside of the wafer after the step of partial cutting of the entire semiconductor wafer.

Next, as shown in FIG. 21, semiconductor wafer 115 is diced from the backside, which has no patterns visible on wafer 115 to use as registration marks for the dicing process. FIG. 21 shows the assembly placed with optically transmissive substrate 100 face down (i.e., circuitry patterned side 117 of wafer 115 is "down") on the vacuum chuck. Scribed alignment marks 240 and 245 on transmissive substrate 100 are visible through glass material 102 to aid alignment. The backside of wafer 115 is then cut according to the patterning registered by the camera and aligned by registration marks 240 and 245. FIG. 21 shows cut 255 in an X-direction and cut 260 in a Y-direction. FIG. 22 shows the backside of wafer 115 after the subsequent step of partial cutting of all of semiconductor wafer 115 in an aligned relation to the patterning on the patterned side of wafer 115, using registration marks 240 and 245 as an aid, so that the assembly may be divided or "singulated" into individual display 300. Wafer 115 is partially cut using a water-cooled wafer dicing saw. The depth of the saw blade is set to cut partially through the thickness of wafer 115, in one embodiment, removing enough material to easily divide wafer 115 in a later process, but retaining enough material to prevent water from entering cell gap 207 (FIG. 11) between wafer 115 and transmissive substrate 100. Wafer 115 is then cut in a wet-sawing process. After the partial cutting, wafer 115 is thoroughly dried.

Optically transmissive glass substrate 100 provides support for semiconductor wafer 115 during the cutting, drying, and handling processes. In addition, optically transmissive substrate 100 prevents wafer 115 from flexing and possibly breaking at the cuts, which would allow water to enter the gap between the substrates. Because of the support provided by transmissive substrate 100, the depth of the saw cut can be very close to the thickness of wafer 115 without significant risk of water leakage, for example, approximately 80% of the thickness of wafer 115 can be cut.

Because no patterns are visible on the backside of semiconductor wafer 115, an alternative process to the process described above with reference to FIGS. 21 and 22 is to mount the programmable camera beneath the dicing saw. Thus, wafer 115 is placed on the vacuum chuck and aligned to a camera mounted under the vacuum chuck. A marking device with X-Y motion capabilities, such as a laser or carbide needle, contacts the backside of wafer 115 and creates two registration marks on the patterned surface of wafer 115. The registration marks are then used in the cutting process.

After the cutting process and the assembly drying process, a dry cutting process is used to scribe transmissive substrate 100. In the embodiment where optically transmissive substrate 100 is glass material 102, the glass must be scribed using a dry process because, after it is scribed, the assembly has no support to prevent the glass or wafer 115 from cracking. Cracks in either substrate would allow any liquid used in the process to enter cell gap 207 between the substrates, i.e., cell gap 207 where liquid crystal material exists or is to be placed.

Figure 23:
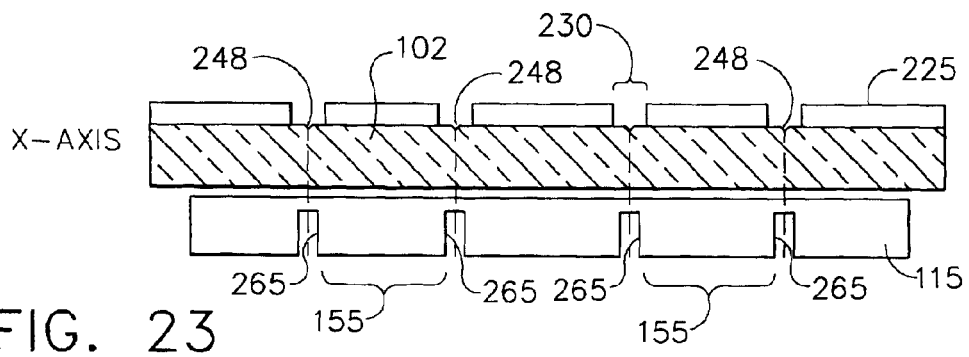
FIG. 23 shows the assembly after the scribing of the glass material in an X-direction.

To scribe optically transmissive substrate 100 in the embodiment where material 102 is a glass substrate, the assembly is placed with pattern-side 117 of wafer 115 facing in the up direction (optically transmissive substrate 100 side "up") on the vacuum chuck of a carbide wheel type glass scribing machine such as that manufactured by Villa Precision International. The glass is scribed with the carbide scribe wheel in the locations where the glass will separate, e.g., directly aligned or in an aligned relation with the scribe areas of wafer 115. The glass can also be cut with a laser process. FIG. 23 shows the assembly after the scribing of glass material 102 in an X-direction. Scribing 248 is located in those areas where optically transmissive substrate will separate. In an X-direction, in this embodiment, scribing 248 is in an aligned relation to scribe areas 265 of wafer 115.

Figure 24:
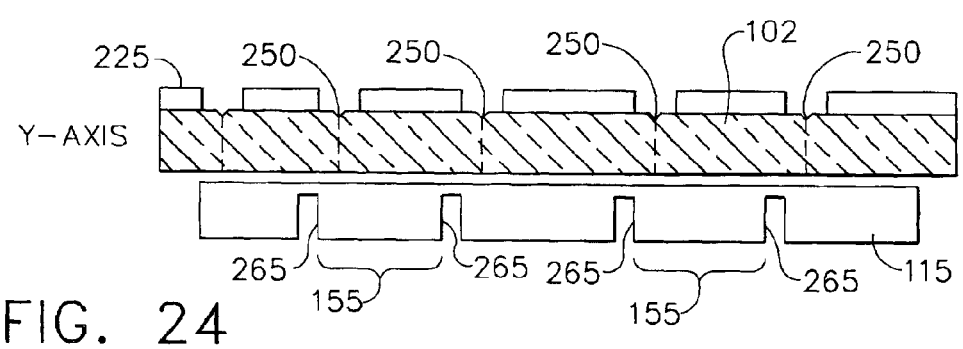
FIG. 24 shows the assembly after the scribing of the glass material in a Y-direction.
Figure 36:
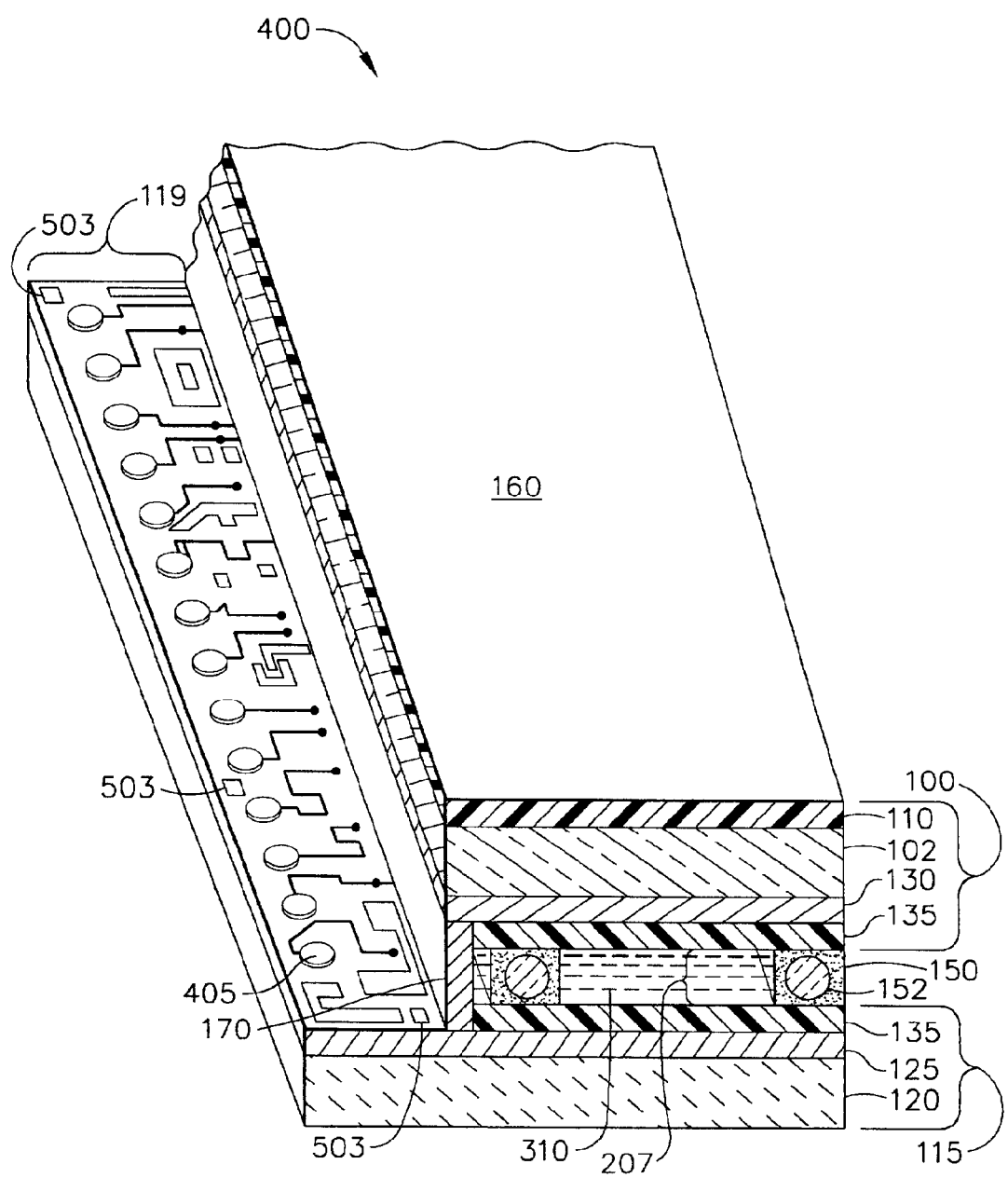
FIG. 36 shows the micro liquid crystal display ready to be packaged into a micro liquid crystal display panel.
Figure 37:
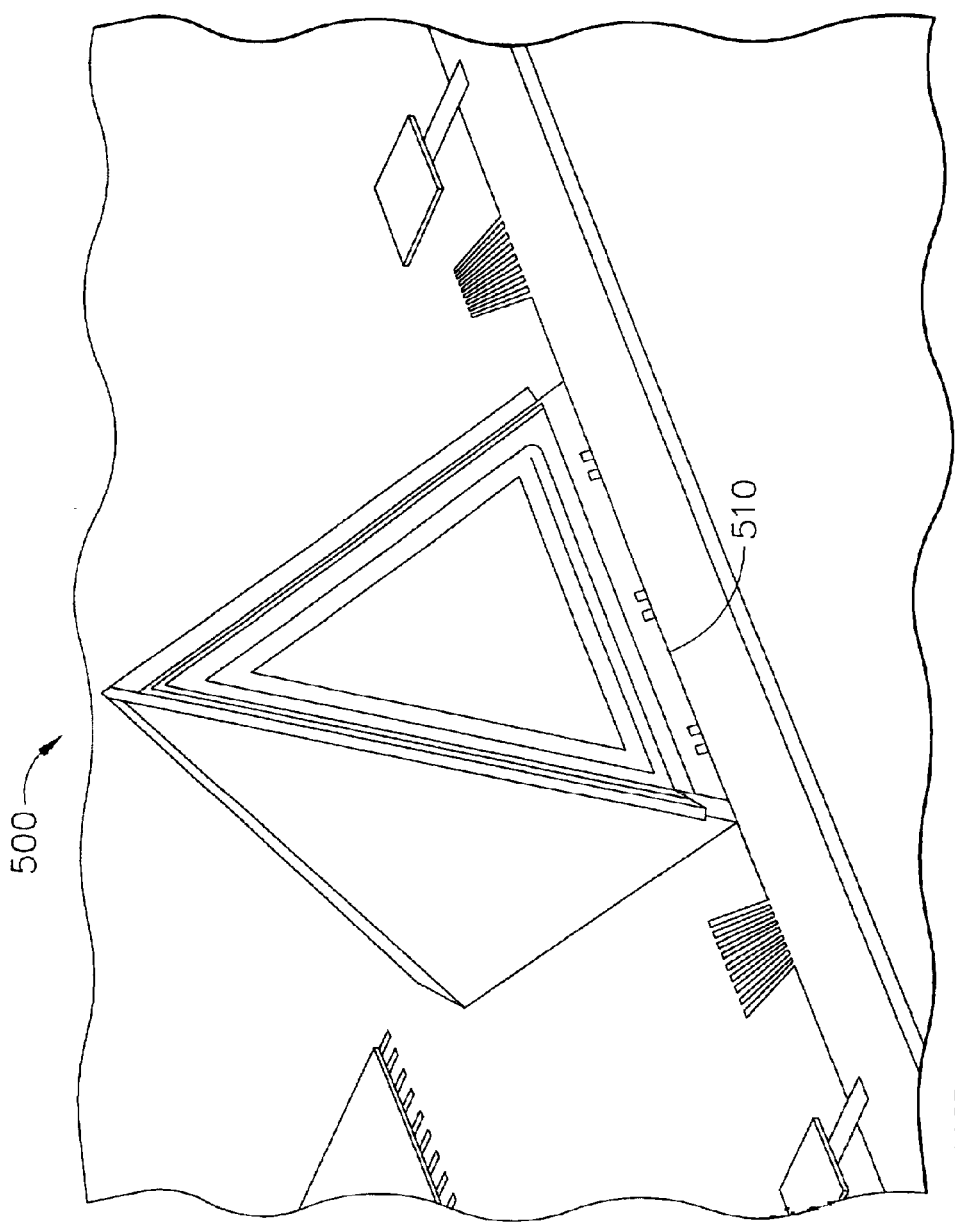
FIG. 37 shows a single-chip radio manufactured by Lucent Technologies Inc.
Figure 38:
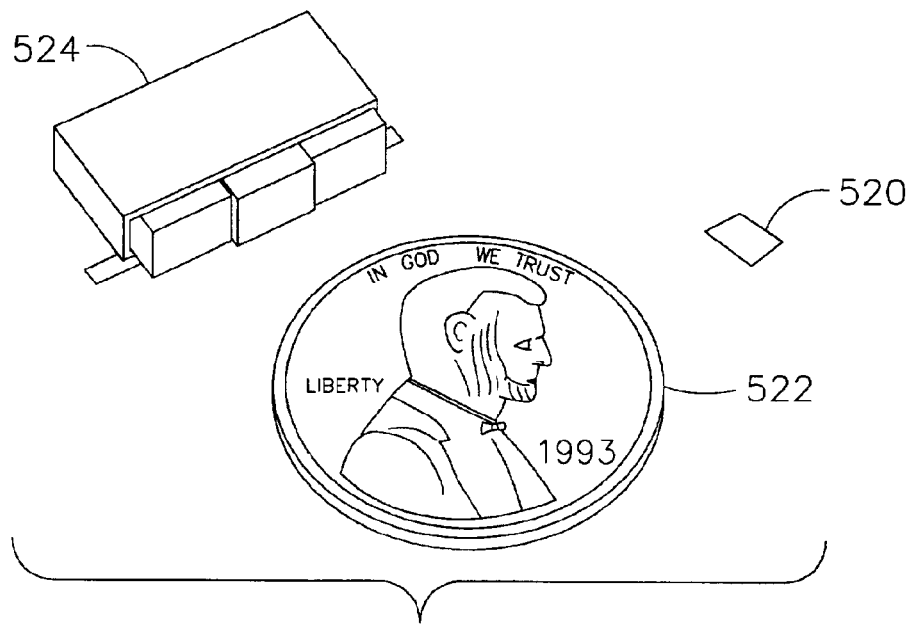
FIG. 38 illustrates a size comparison between a U.S. penny, a conventional ceramic filter, and a miniature RF filter.
Figure 39:
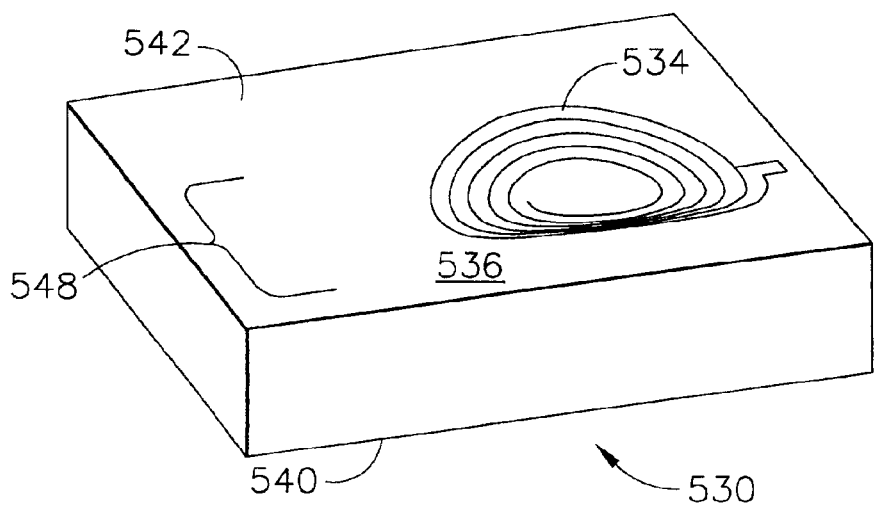
FIG. 39 shows a tank circuit having a miniature inductor and capacitor.

FIG. 24 shows the assembly after the scribing of glass material 102 in a Y-direction. In a Y-direction, glass material 102 is not scribed directly over scribe areas of wafer 115. Instead, scribing 250 is slightly offset. The offsetting serves to expose a portion of wafer 115 as offset portion 119 for each eventual display. The exposure of offset portion 119 of wafer 115 is done to allow a subsequent step of making an electrical connection to the individual display when the display is packaged. Offset portion 119 is best seen in FIG. 35 and FIG. 36. Exposed area 119 of the individual display may have bond pads 405 or other contacts coupled to the circuit devices of the individual display as seen in FIG. 36.

Figure 25:
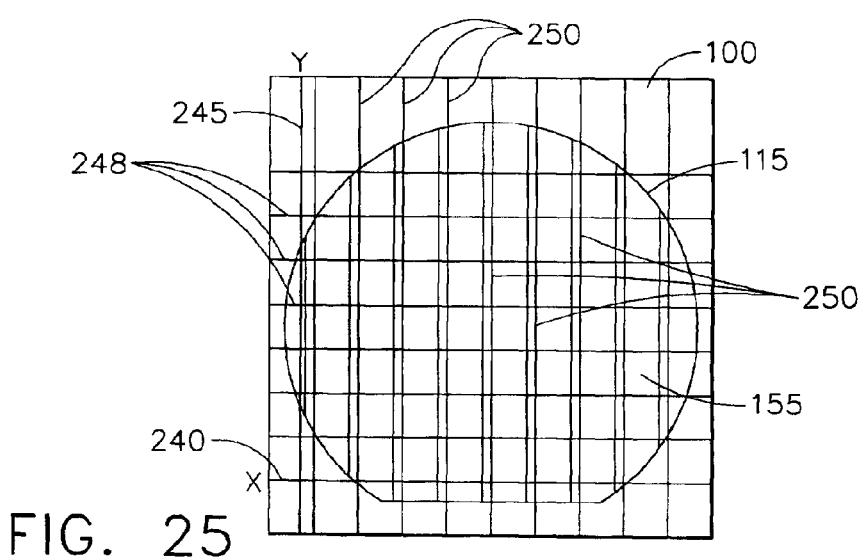
FIG. 25 shows a top view of the assembly with the pattern-side of wafer facing in the up position.

FIG. 25 shows a top view of the assembly with pattern-side 117 of wafer 115 facing in the up position (optically transmissive substrate 100 side "up"). FIG. 25 shows transmissive substrate 100 scribed in areas where transmissive substrate is to be separated, i.e., scribing 248 in an X-direction directly aligned with or in an aligned relation with the scribe areas of wafer 115 and scribing 250 in a Y-direction offset from the corresponding Y-axis scribe areas of wafer 115.

After transmissive substrate 100 is scribed, scribe marks 248 and 250 are "vented." Venting is the process by which optically transmissive substrate 100, such as a glass, is cracked at the location of the scribe so as to directionally propagate the crack through the thickness of glass substrate 100. The venting can be accomplished either manually or using an automated machine process.

Figure 26:
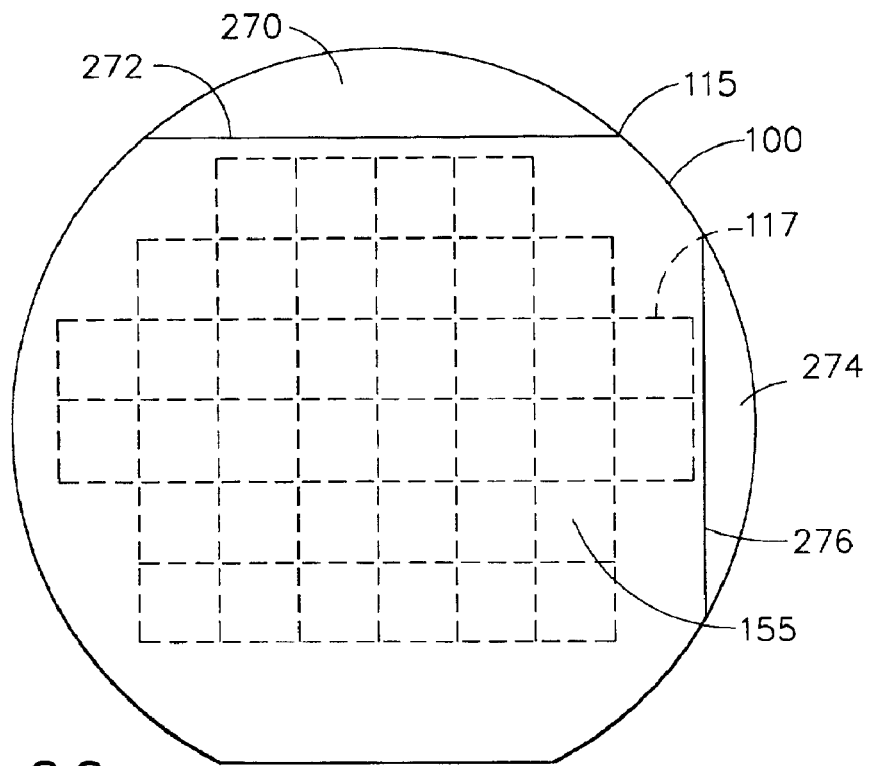
FIG. 26 shows an embodiment where the perimeter of the transmissive substrate follows the generally round perimeter of the wafer.

A singulation process embodiment preferred over the square glass singulation process described in connection with FIGS. 18 through FIG. 25 will now be described. FIG. 26 shows an embodiment where the perimeter of transmissive substrate 100 follows the generally round perimeter of wafer 115. Since the perimeter of transmissive substrate 100 follows the round perimeter of wafer 115, the same equipment used to handle wafer 115 may be used to handle substrate 100.

Figure 27:
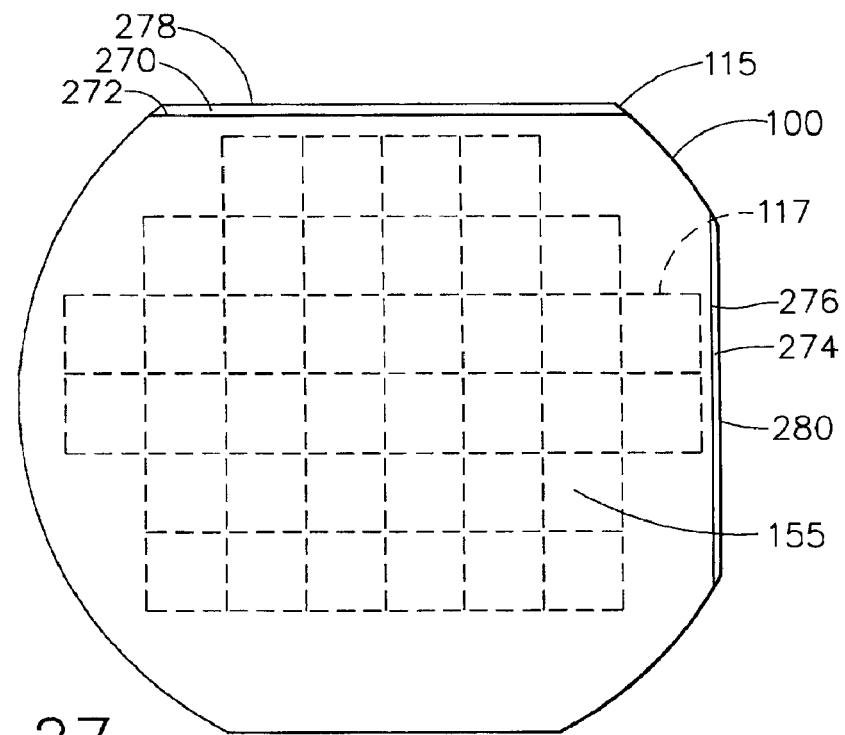
FIG. 27 shows material removed from the wafer to provide X- and Y-registration.

As shown in FIG. 26, wafer 115 with round glass substrate 100 is mounted to a vacuum chuck with pattern-side 117 of wafer 115 facing in the up direction. Material is removed from substrate 100 in the X-direction to reveal top exposed wafer 270 and X-surface substrate 272 and in the Y-direction to reveal side exposed wafer 274 and Y-surface substrate 276 as shown. As shown in FIG. 27, at top exposed wafer 270, material is removed from wafer 115 parallel to X-surface substrate 272 to form X-registration 278. At side-exposed wafer 274, material is removed from wafer 115 parallel to Y-surface substrate 276 to form Y-registration 280.

With X-registration 278 and Y-registration 280 machined into wafer 115, wafer 115 is flipped over so that pattern-side 117 is facing down. Now, cuts similar to those shown in FIG. 21 and FIG. 22 may be made into backplane 120 using the relative registration provided by X-registration 278 and Y-registration 280. Transmissive substrate 100 may now be scribed and vented as discussed in connection with FIGS. 23, 24, and 25.

This round glass method is preferred since it eliminates the extra handling tools needed to handle a square piece of glass. This is especially acute when the diameter of wafer 115 is 8.0 inches. There, the diagonal of a square piece of glass exceeds 11.3 inches—a length in which most existing equipment in this area is not capable of handling.

Figure 28:
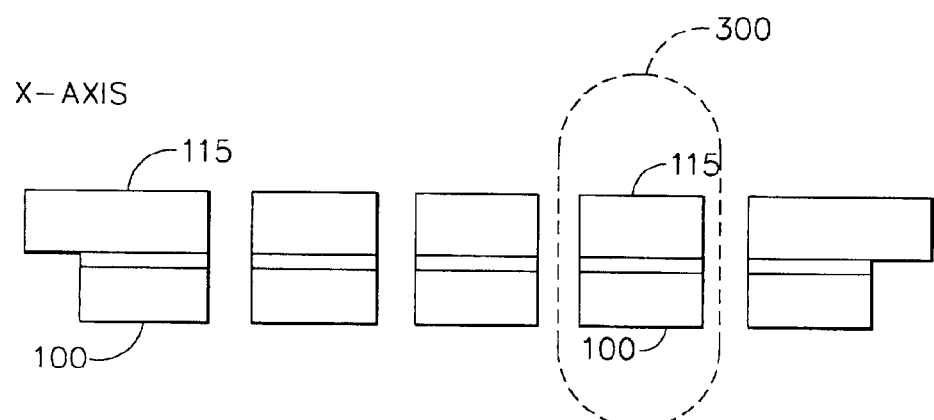
FIG. 28 shows the separated individual display assemblies 300 from an X-direction.
Figure 29:
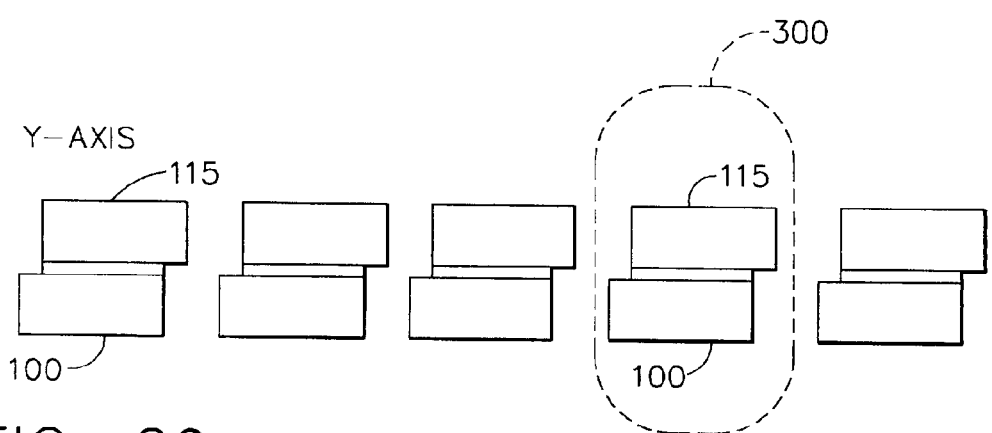
FIG. 29 shows the same assemblies 300 from a Y-direction.

Once transmissive substrate 100 is vented, the remaining silicon material at the scribe locations unifying wafer 115 can be easily broken and the individual display assemblies separated as shown in FIGS. 28 and 29. FIG. 28 shows the separated individual display assemblies 300 from an X-direction and FIG. 29 shows the same assemblies 300 from a Y-direction.

An alternative to the above assembly, cutting, scribing, and venting process is to divide the substrates individually. For example, wafer 115 can be cut into individual device, then assembled to an individual transmissive substrate panel of substrate 100. In this manner, the scribe marks on wafer 115 can be used to cut wafer 115 into the individual display device from the top (i.e., circuitry patterned-side 117 facing up). Optically transmissive substrate 100 components can then be properly aligned and coupled to wafer 115 in a process similar to that described above with coupling substrate 100 to wafer 115. A third alternative is to assemble a similarly sized transmissive substrate 100 to wafer 115 prior to dividing the assembly into individual display devices 300. In this embodiment, concerns over cutting wafer 115 from the non-patterned side are addressed by mounting the camera below the dicing saw to align the cuts to the scribe marks on the patterned side of wafer 115.

Once the individual display devices 300 are separated from the wafer, they are either filled with liquid crystal material or, if already filled, sealed at their fill ports to retain liquid crystal material 220 in cell gap 207. Recall that in FIG. 8 and, the accompanying text, perimeter seal material 150 surrounded the wafer to define each individual display device or assembly and fill port 167 was left to allow the placement of liquid crystal material 220 in display area 160. Where liquid crystal material 220 is located in cell gap 207 of display area 160 of device 300, fill port 167 is filled by the application of an ultraviolet cure adhesive that is cured with an ultraviolet light.

Figure 30:
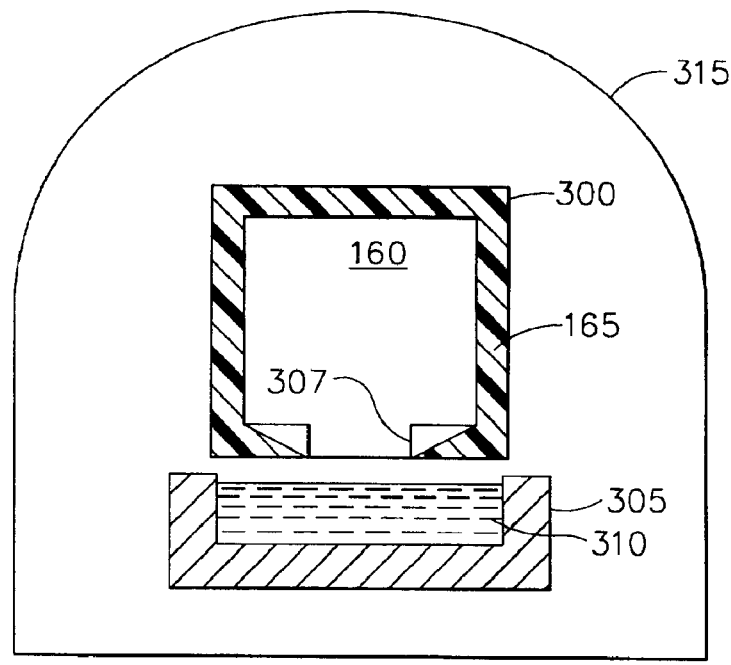
FIG. 30 shows a singulated device put in a vacuum chamber.
Figure 31:
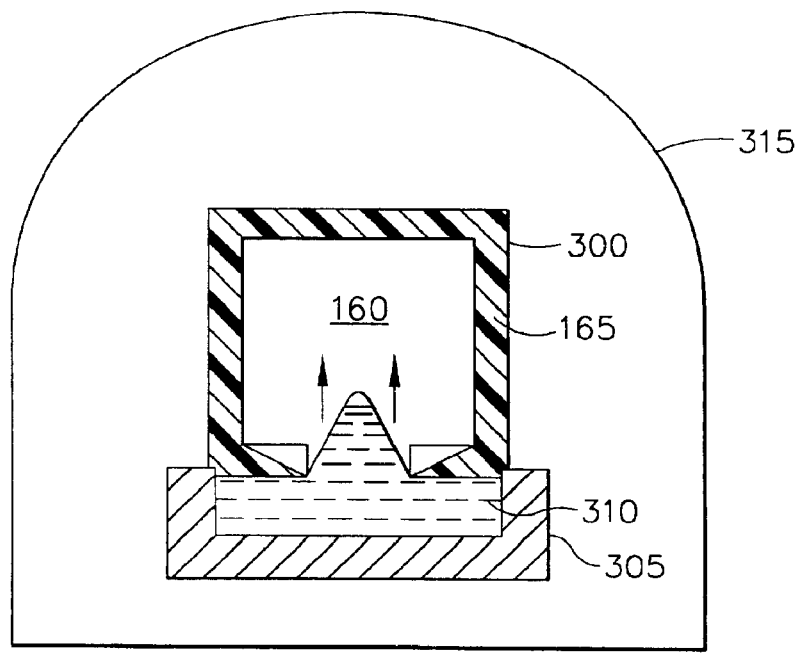
FIG. 31 shows liquid crystal material forced into the display area due to a capillary junction.

FIGS. 30 and 31 illustrate the situation where the individual display devices 300 have not been previously filled with liquid crystal material 220. In FIG. 30, singulated device 300 is put in vacuum chamber 315. Chamber 315 then is evacuated until the pressure reaches $10^{-1}$ Torr. Display device 300 is lowered so that the end of device 300 having fill port 307 contacts liquid crystal material 310 in bath 305. Fill port 307 may be of fill port 167 shown in FIG. 8. Chamber 315 is pressurized with air to atmospheric pressure and the pressure difference between cell gap 207 (FIG. 11) and the ambient pressure forces liquid crystal material 310 into display area 160 as shown in FIG. 31. Once the individual display device 300 is filled with liquid crystal material 310, the excess liquid crystal is cleaned off fill port area 307 and an ultraviolet cure adhesive is applied to fill port 307. The adhesive is then cured with ultraviolet light to seal display area 160 of display device 300.

Figure 32:
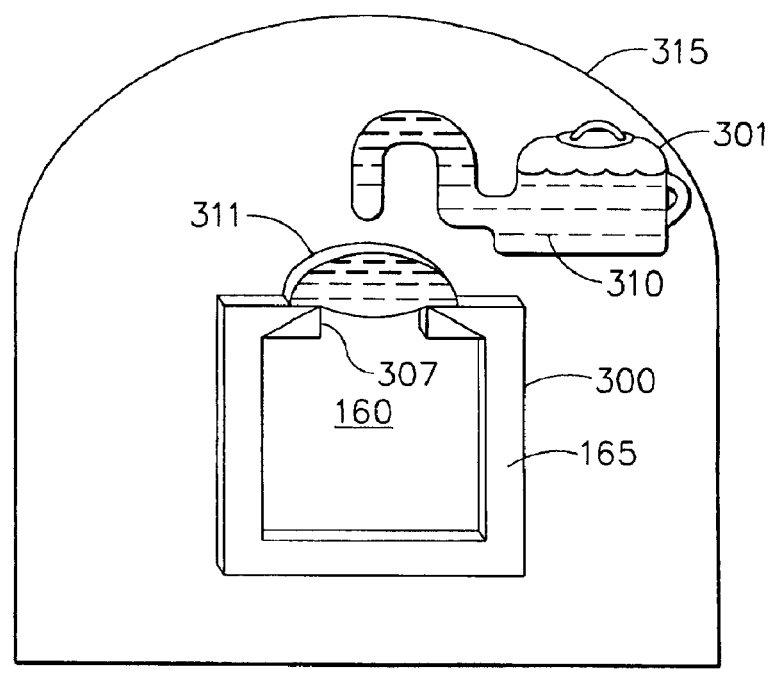
FIG. 32 shows a singulated device position with the fill port facing up within a chamber.
Figure 33:
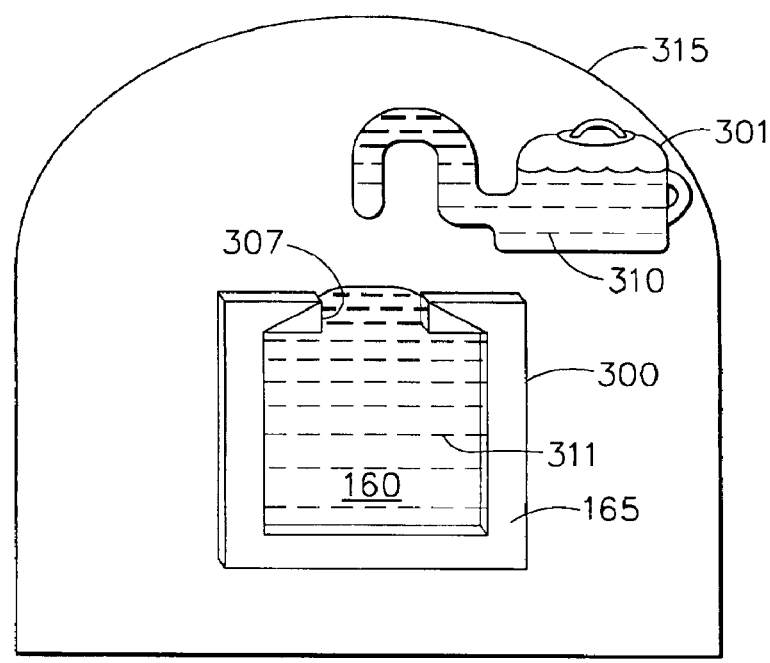
FIG. 33 illustrates the chamber in the pressurized state.

An singulated fill embodiment preferred to that described in connection with FIG. 32 and FIG. 33 will now be described. FIG. 32 shows singulated device 300 position with fill port 307 facing up within chamber 315. First, air is vacuumed from chamber 315. Then, a drop of liquid crystal material 310 is placed over fill port 307 by dropper 301. Dropper 301 is preferably in the shape of a short, sturdy, little teapot having a spout and a handle. With perimeter seal area generally spanning one-half inches and fill port 207 generally spanning two microns, surface tension holds liquid crystal material drop 311 in place.

With drop 311 in place, chamber 315 is pressurized. FIG. 33 illustrates chamber 315 in the pressurized state. As chamber 315 is pressurized, the pressure within viewing area 160 is less than the pressure in the remaining area of chamber 315. Due to this pressure difference, liquid crystal material drop 311 is forced into viewing area 160 as assisted by gravity. Excessive liquid crystal material 311 is cleaned off. Fill port 307 is then plugged with ultraviolet cure adhesive and this adhesive is then cured with an ultraviolet light.

FIG. 34 illustrates a cross-section of individual display 300 from an X-direction, whereas FIG. 35 shows the same assembly from a Y-direction. FIGS. 34 and 35 show liquid crystal material 310 positioned in cell gap 207 between optically transmissive substrate 100 and wafer 115.

FIG. 36 shows micro liquid crystal display 400 in a state where micro liquid crystal display 400 is ready to be packaged into a micro liquid crystal display panel. First, overhang 330 of substrate 100 shown in FIG. 35 is removed by, for example, applying a scribe or laser to the glass overhang of display 300. Then, the material comprising alignment layer 135 disposed in offset portion 119 is removed to expose land pads 405 and other electrical components located in that area. Alternatively, this area may have been masked or alignment layer 135 may be retained only to be pierced using a push through technique. Land pads are electrical contact pads that permit electrical communication between the circuitry within micro liquid crystal display 400 and devices external to micro liquid crystal display 400 such as a device driver located on a driver board. Micro liquid crystal display 400 may then be enclosed within an anti-static bag and packaged for shipment with other displays 400 in a box or some other convenient shipping container.

Figure 40:
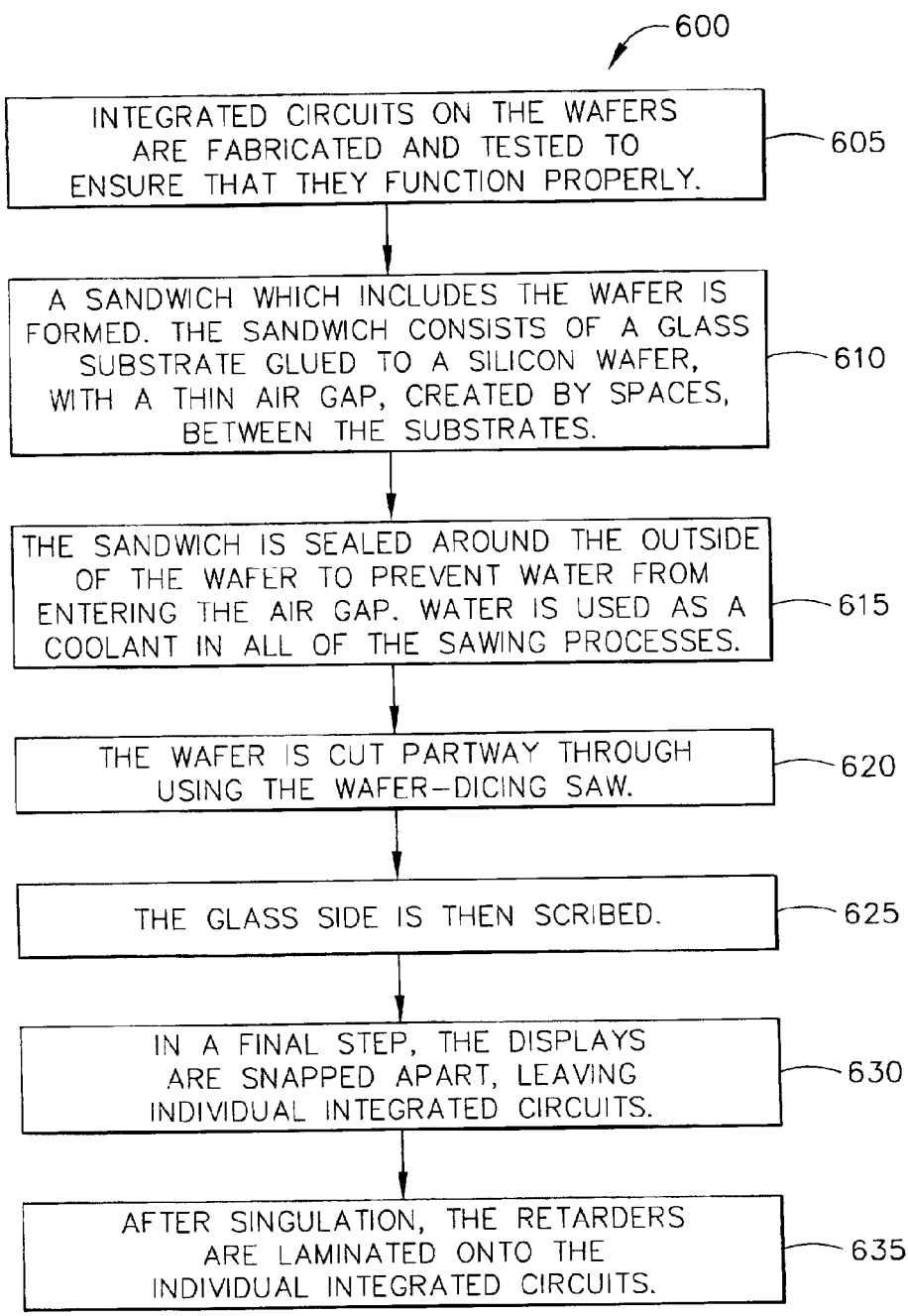
FIG. 40 shows an old method for fabricating a light modulation system on a semiconductor substrate where the integrated circuits are singulated from a wafer and then an optical element layer is applied.

FIG. 40 shows a method 600, which had been previously used in the fabrication of a light modulation system. Typically, the integrated circuits are at least partially tested to ensure their proper functioning in operation 605 prior to singulation in operation 635. Operation 610 creates the sandwich as initially consisting of a glass substrate glued to a silicon wafer, with a thin air gap between the substrates. In operation 615, the sandwich is sealed around the outside to prevent water from entering the gap. Water is used as a coolant in the cutting-process that follows operation 615. In operation 620, a wafer-dicing saw is used to cut partway through the silicon. The glass side is then scribed in operation 625. The cut on the silicon and the scribe on the glass side are offset so that when the displays are snapped apart, the bonding pads on the silicon are exposed and a corresponding overhang of glass is left on the other side. In operation 630, the displays are snapped apart, leaving individual integrated circuits. In operation 635, the retarders are laminated onto the individual integrated circuits. This process is very labor intensive, which gives rise to the need for a process on the wafer scale. There is also a need for a glass cover, which is used to protect the retarder because it is easily damaged and often gets scratched on such a small-scale process.

Figure 41A:
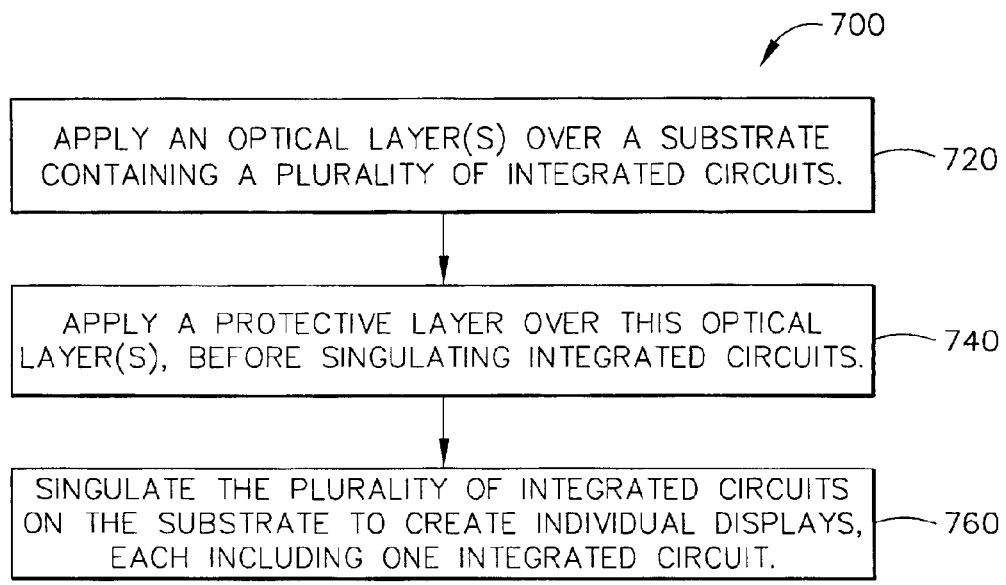
FIG. 41A is an example of a method for fabricating a light modulation system on a semiconductor substrate by applying the laminate retarder (optical element) onto the surface of the entire wafer instead of the individual integrated circuits and applying a protective layer over the laminate retarder.

FIG. 41A illustrates a flow chart of the generic method of one embodiment of the invention. A light modulating system is fabricated using this method. In operation 720, an optical layer or a plurality of optical-layers (e.g. a retarder) is applied over a substrate that includes a plurality of integrated circuits, each of which is capable of creating a separate display device. In operation 740, a protective layer is applied over the optical layer(s) (e.g. the retarder). In operation 760, the plurality of circuits on the substrate is singulated.

Figure 41B:
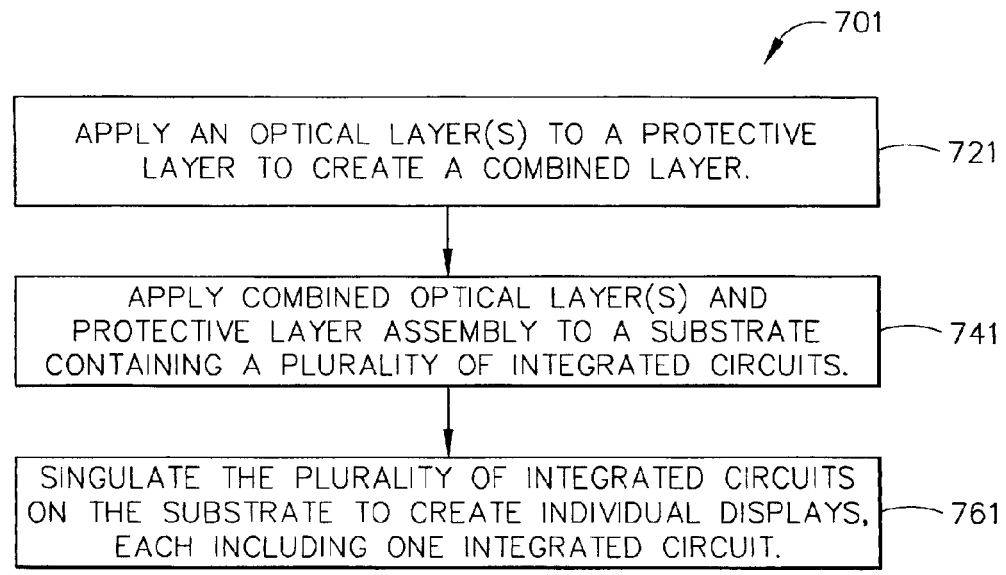
FIG. 41B is an alternate embodiment of a method for fabricating a light modulation system on a semiconductor substrate. An optical layer(s) (e.g. a retarder) is applied to a protective layer, creating a combined layer. This combined layer (protected optical layer) is applied to the surface of the entire wafer.

FIG. 41B is a flow chart illustrating an alternate embodiment of the generic method of the invention. A light modulating system is also fabricated using this method. A combined layer is created in operation 721 by applying an optical layer(s) to a protective layer. The combined layers are then applied to a substrate containing a plurality of integrated circuits in operation 741. In operation 761, the plurality of integrated circuits is singulated to create individual displays.

Figure 42A:
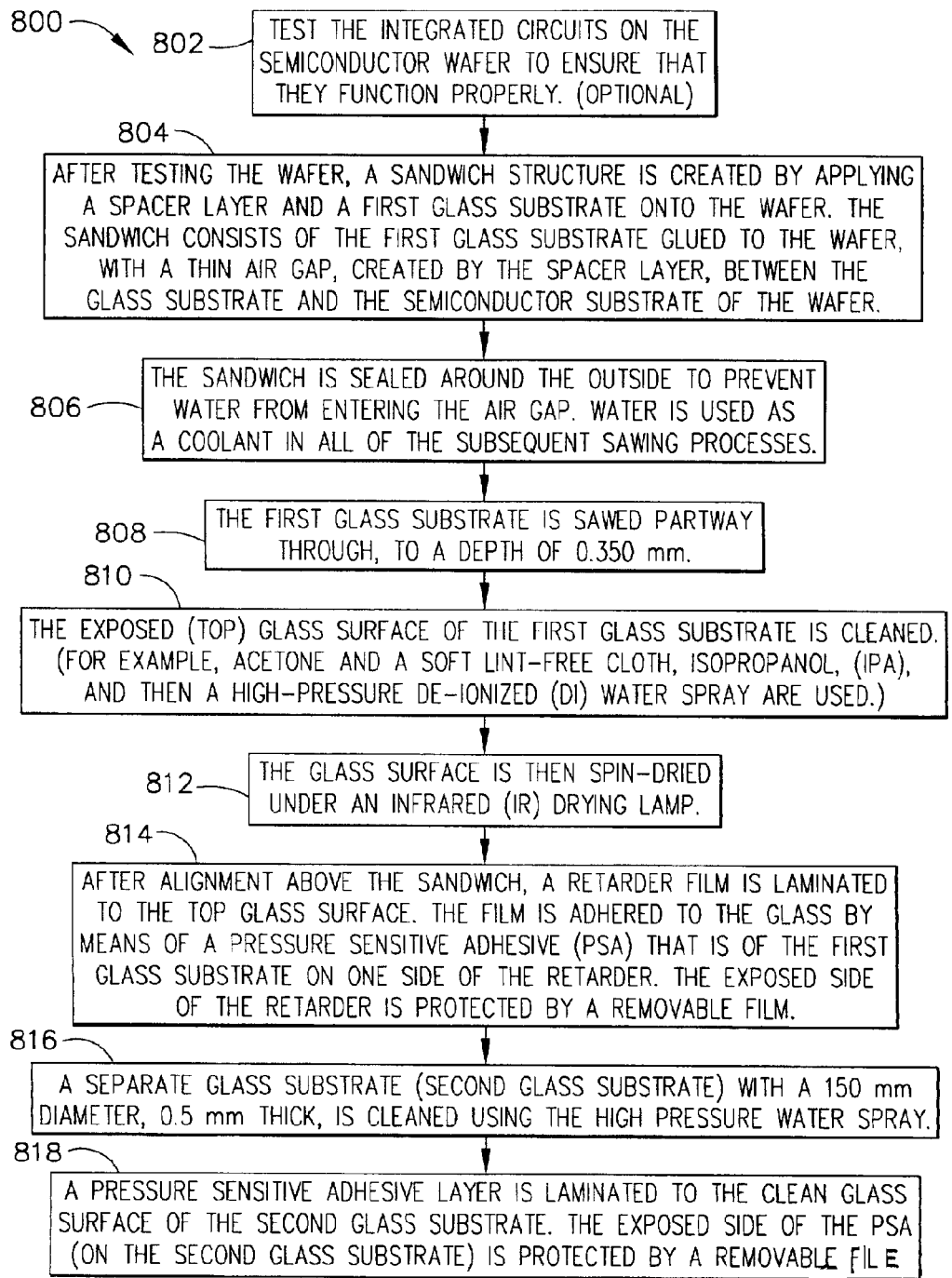
FIGS. 42a, 42b and 42c show a method used in the fabrication of the light modulation system on a semiconductor substrate.
Figure 42B:
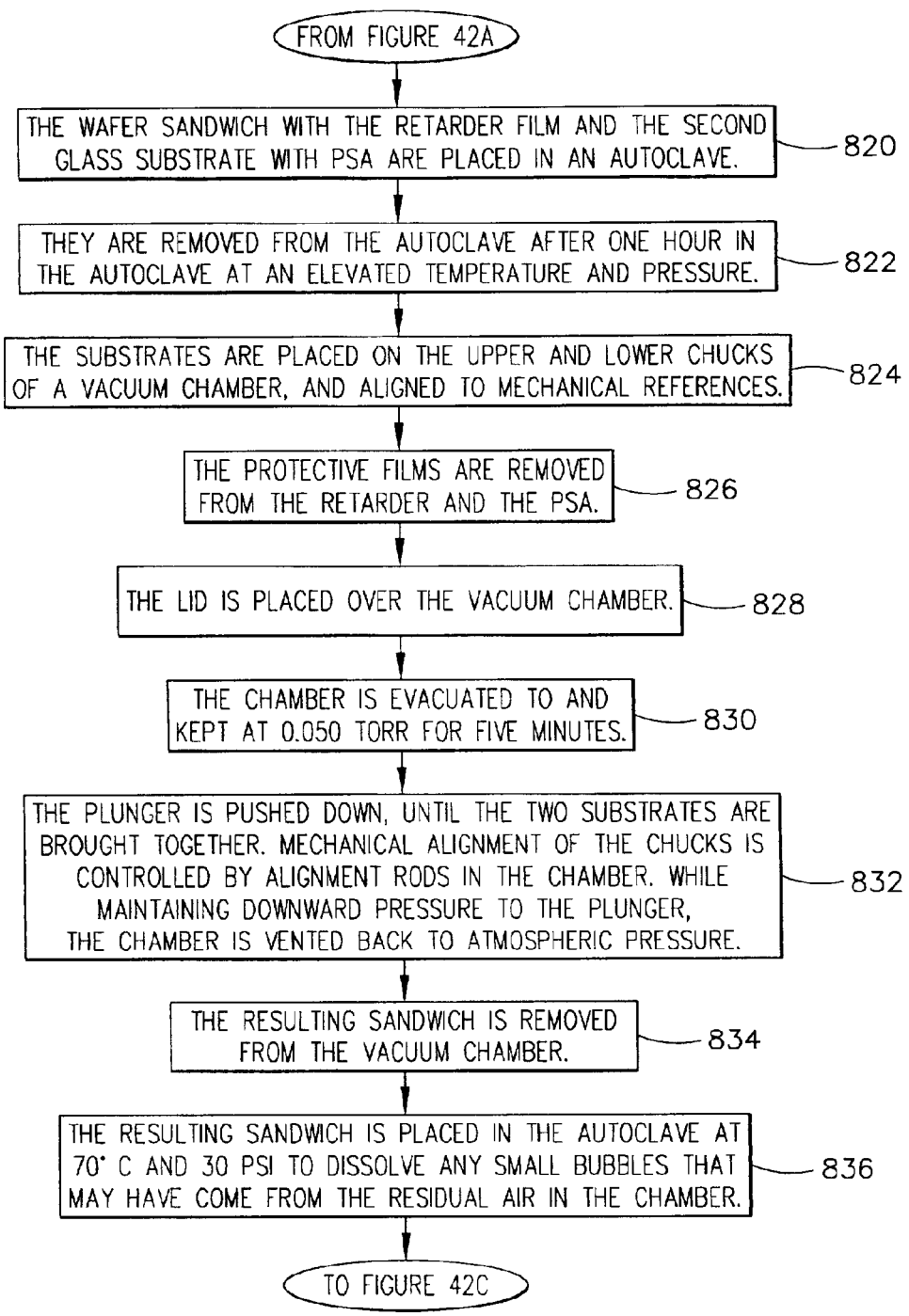
Figure 42C:
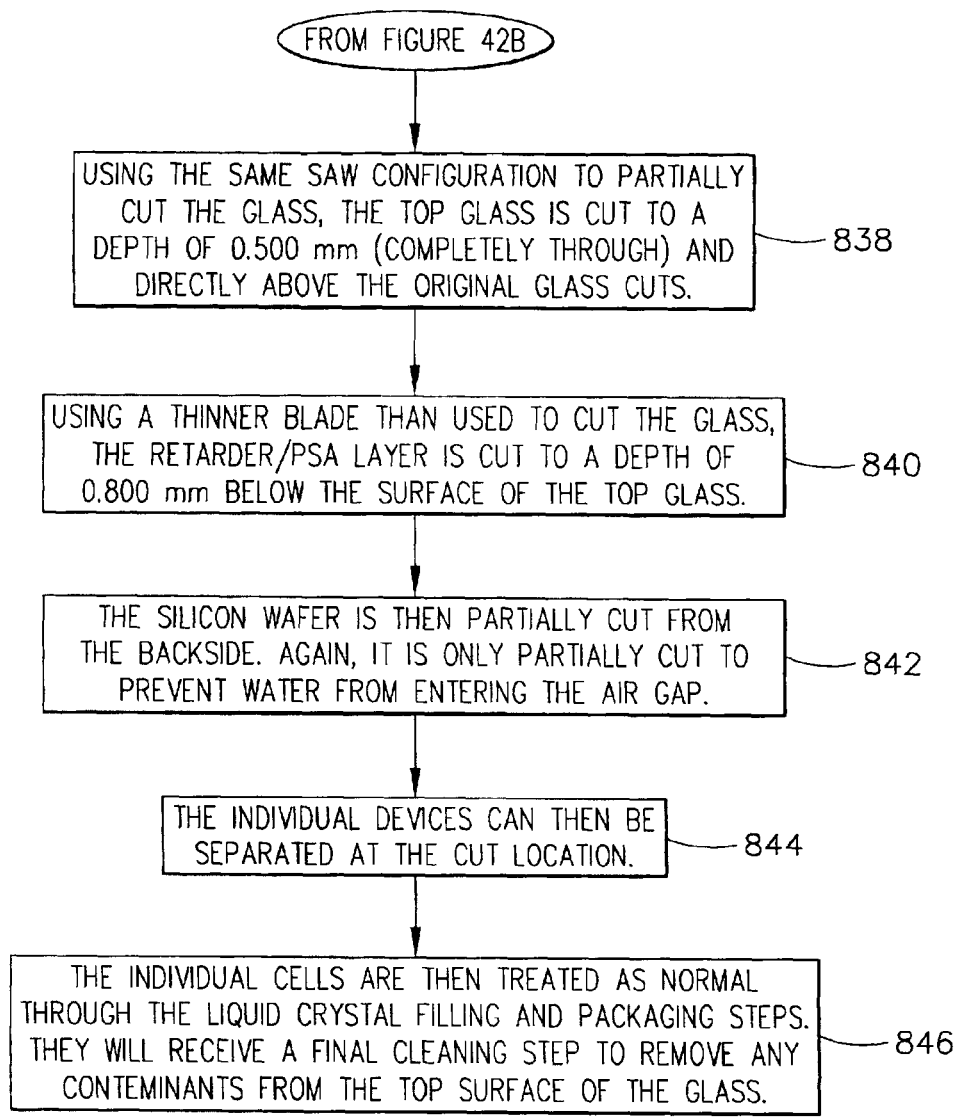
Figure 45:
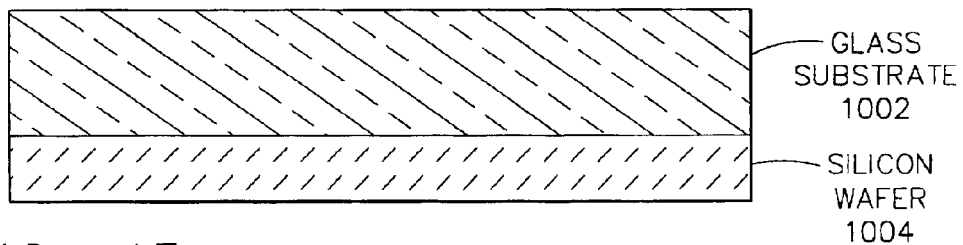
FIG. 45 illustrates the first glass substrate on the silicon wafer.
Figure 46:
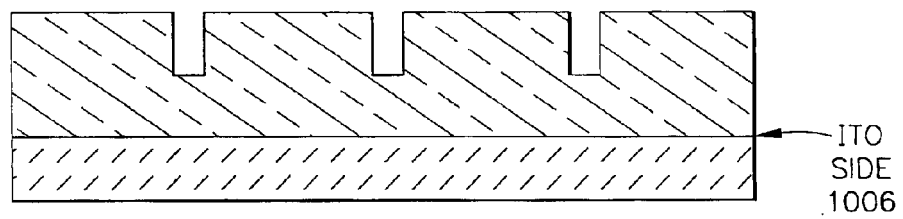
FIG. 46 shows the glass substrate on the silicon wafer after it has been cut (first cut).
Figure 47:
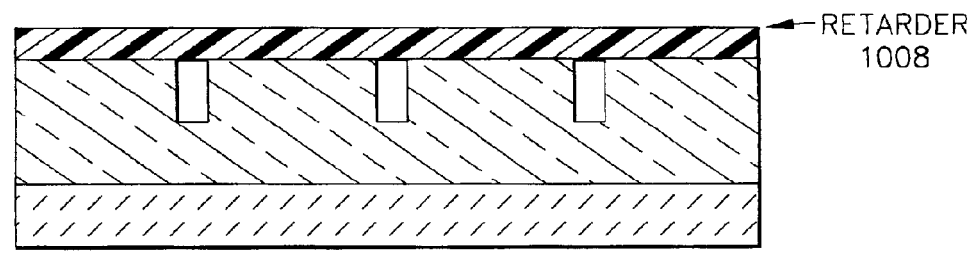
FIG. 47 shows the retarder applied over the cut glass, which is over the silicon wafer.
Figure 48:
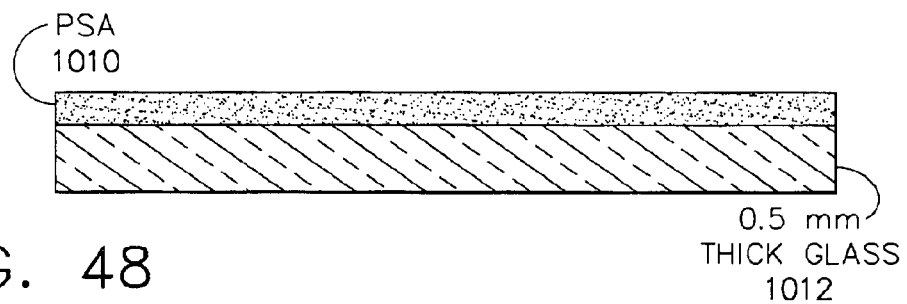
FIG. 48 shows a top glass/pressure sensitive adhesive (PSA) assembly.
Figure 49:
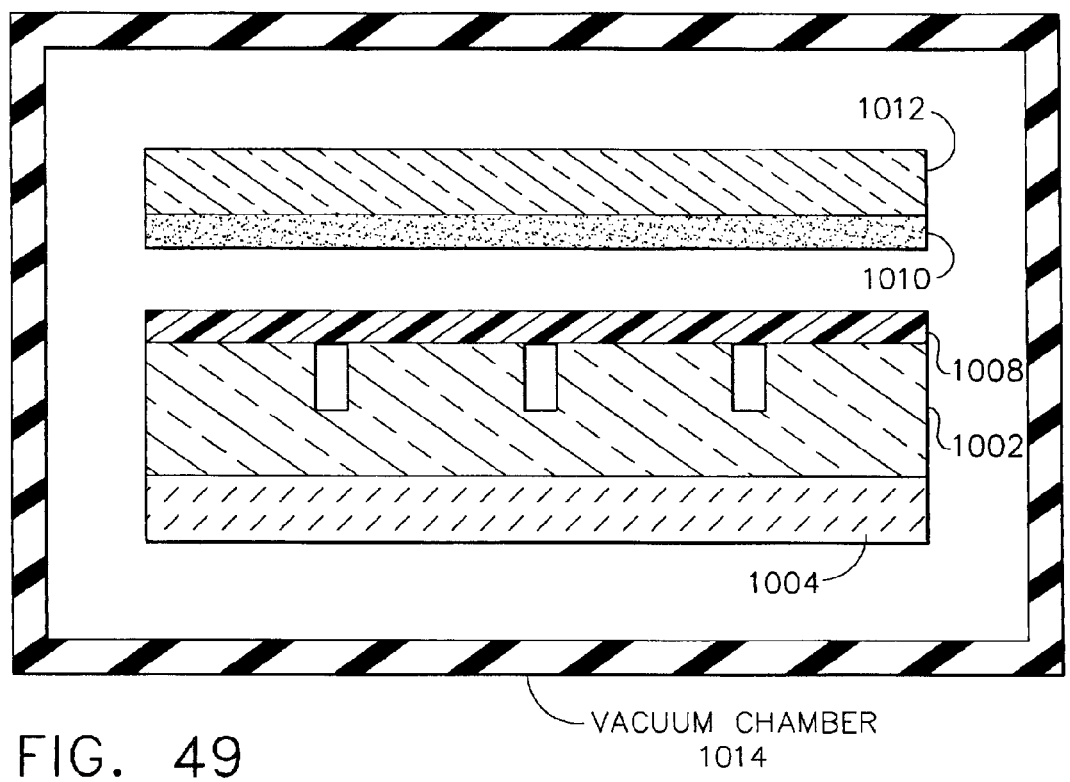
FIG. 49 illustrates the top glass/PSA assembly and the cut glass substrate wafer in a vacuum chamber.
Figure 50:
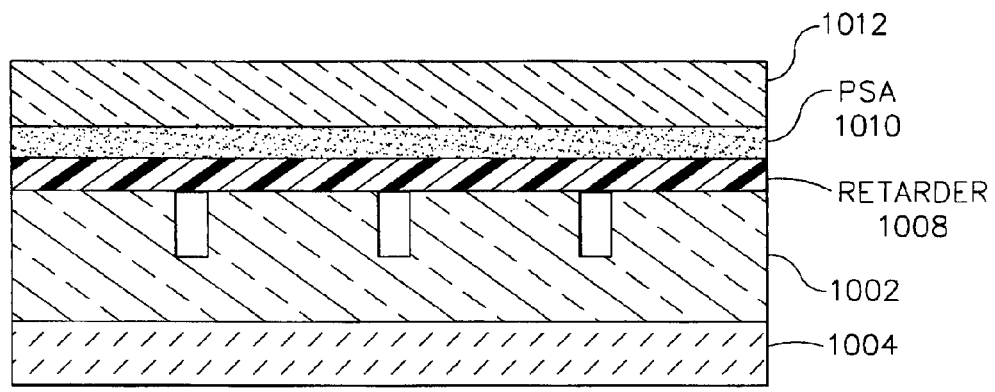
FIG. 50 shows the top glass/PSA assembly as it is fused onto the retarder layer.
Figure 51:
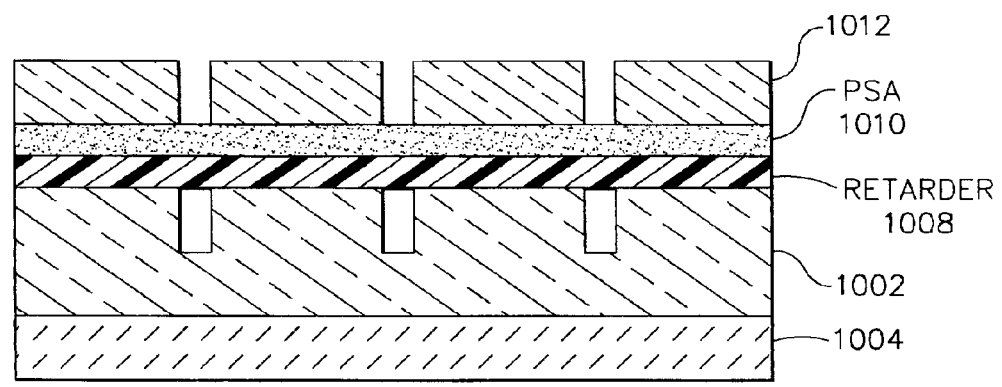
FIG. 51 shows cuts into the top glass layer.
Figure 52:
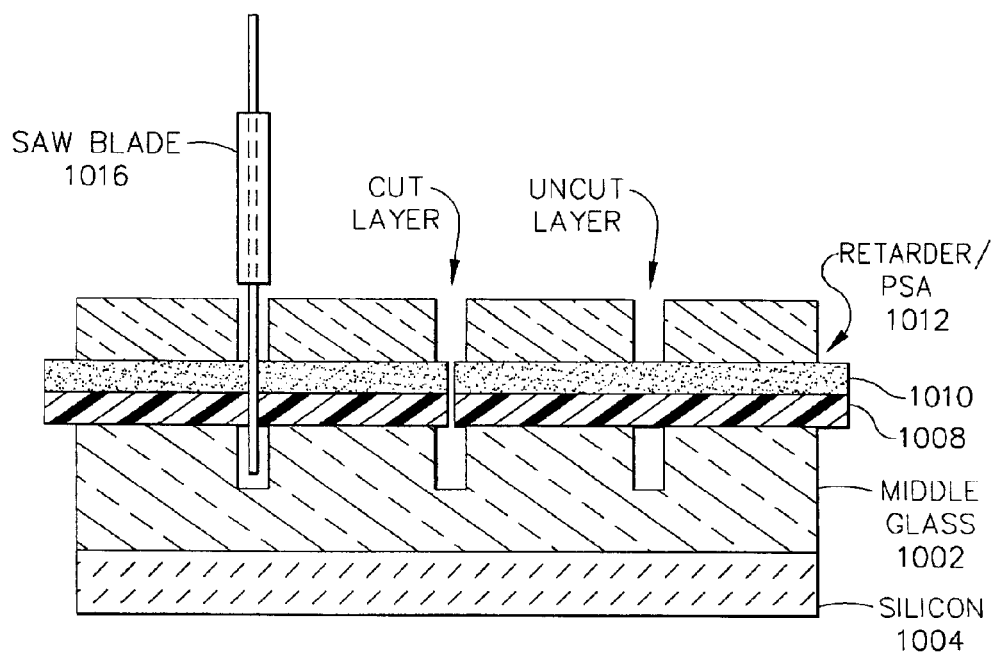
FIG. 52 illustrates the cuts made with a saw blade into the retarder layer.
Figure 53:
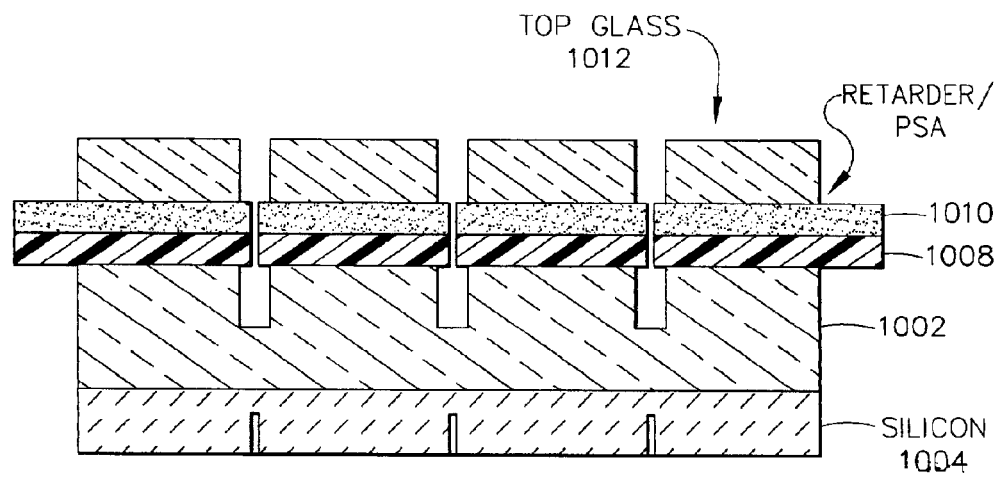
FIG. 53 shows the partial cuts made into the back of the silicon layer.
Figure 54:
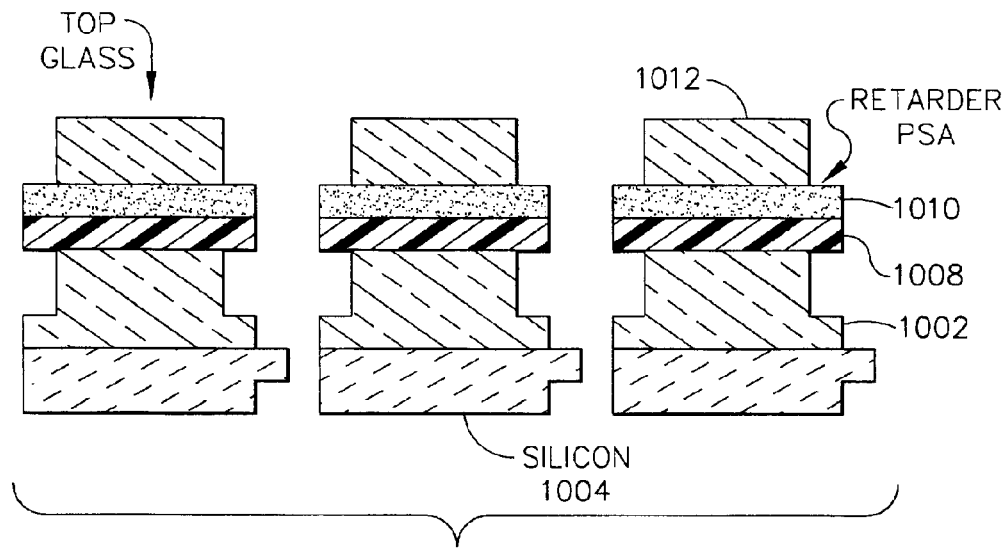
FIG. 54 shows the individual integrated circuits with the retarder layer after the wafer has been cut.

FIGS. 42a, 42b, and 42c show an exemplary method 800 in a flow diagram, which describes the lamination of an optical element or retarder on a wafer-scale level. In operation 802, the integrated circuits (ICs), while still a part of the wafer, are at least partially tested to ensure that they function properly. Each of these ICs, after singulation are used to create a LCOS display, such as the LCOS display described in U.S. Pat. No. 6,078,303 which is hereby incorporated herein by reference. This testing is optional and may be performed after final assembly. Operation 804 creates a sandwich, which consists of a first glass substrate glued to a silicon wafer, with a thin air gap between the substrates. The first glass substrate here in one embodiment is Corning 1737F, with a 150 mm diameter and is 0.7–1.1 mm thick. A spacer layer is created on the circuit side of the semiconductor wafer and then the first glass substrate is applied over the spacer layer. Typically, the spacer layer is attached to the wafer and the first glass substrate is attached to the spacer layer. The spacer layer may be, a conventional raised border, which surrounds each integrated circuit's display array and will create a gap into which a nematic liquid crystal is inserted. The first glass substrate may be a conventional cover glass which includes an Indium Tin Oxide (ITO) transparent electrode layer and an alignment layer (for aligning the liquid crystal molecules) on the bottom side (facing the wafer) of the first glass substrate. FIG. 45 shows a cross-sectional view of the first glass substrate 1002 attached to a semiconductor wafer 1004 without showing the spacer layer which separates the bottom surface of the first glass substrate from the upper (circuit side) surface of the semiconductor wafer 1004. FIG. 46 shows the location of the ITO side of the first glass substrate relative to the silicon wafer. In operation 806, the sandwich is sealed around the perimeter of the wafer to prevent water from entering the air gaps. In operation 808, the first glass substrate is sawed partway through, to a depth of 0.350 mm. The partial cut allows the glass to be separated at a later step, but prevents water from entering the air gap. This is done using a K & S 984-10 Dicing Saw. A 10 mil resin blade made of diamond particles is used at a speed of 6 mm/sec. This blade is usually used to cut hard substances such as glass. FIG. 46 illustrates the first glass substrate 1002 attached on the silicon wafer 1004 after it has been cut. In operation 810 the top of the first glass surface is cleaned and in operation 812, it is spin-dried. After operation 812, the sandwich is aligned relative to the retarder film. An example of a method for aligning this retarder film is described in U.S. patent application Ser. No. 09/564,473 filed May 3, 2000 by Douglas McKnight and this application is incorporated herein by reference. After alignment with the sandwich in operation 814, the retarder film is laminated onto the top glass surface of the first glass substrate by means of a pressure sensitive adhesive (PSA). A 45 nm retarder film with PSA, available from Polatechno, is used in one embodiment. The exposed (top) side of the optical element (e.g. retarder) is covered with a protective film. FIG. 47 illustrates an example of the optical element layer(s) (e.g. a retarder layer or multiple retarder layers, polarizer film, or a combination of retarder and polarizer film) 1008 after it has been attached to the cut first glass substrate. In operation 816, a separate glass substrate (a second glass substrate) is cleaned using an Ultratech 602 high-pressure de-ionized water cleaning system. The second glass substrate is a similar shape to the first glass substrate and may also be Corning 1737F with a thickness of 0.3 to 0.5 mm. The second glass substrate is laminated with a pressure sensitive adhesive in operation 818. The PSA is a conventional 3M PSA film, 0.001 to 0.002 inches thick. FIG. 48 shows second glass substrate 1012 as it is adhered to the PSA layer 1010. While a glass protective layer, which is used as the second glass substrate 1012, has been described, it will be appreciated that other types of materials may be used as a protective layer. One example of an alternative material is epoxy which maybe spun onto the optical layer's surface after applying the optical layer to the first glass substrate 1002. One example of a spin-coatable protective layer is a UV cured epoxy from Master Bond, Inc. (Product Number UV 11-3). The exposed side of the pressure sensitive adhesive is covered with a protective film. In operation 820, the wafer sandwich with the retarder film and the second glass substrate with PSA are placed in an autoclave. The autoclave is a chamber that is set to an elevated pressure of 30 psi and temperature of 70° C. (without steam). In operation 822, the wafer is removed from the autoclave after one hour. The two substrates, in operation 824, are placed on the upper and lower chucks of a vacuum chamber. The wafer sandwich is placed on the lower chuck, and aligned to alignment fixtures and the second glass/PSA layer substrate is placed on the top chuck and aligned to alignment fixtures as illustrated in FIG. 49. The protective films are removed from the retarder and the top glass PSA in operation 826 and the lid is placed on the vacuum chamber in operation 828. Since there is almost no air in the vacuum chamber, there is almost no air that will get trapped between the substrates. In operation 830, the chamber is evacuated to and kept at 0.050 torr for five minutes. The plunger is pushed down in operation 832 until the glass/PSA substrate is brought together with the retarder/sandwich substrate. Alignment rods in the chamber control the alignment of the two substrates. While maintaining downward pressure to the plunger, the chamber is vented back to atmospheric pressure. The resulting sandwich is removed from the vacuum chamber in operation 834. In operation 836, the resulting sandwich is placed in the autoclave at 70° C. and 30 psi to dissolve any small bubbles that may have come from the residual air in the chamber. The resultant product is shown in FIG. 50. The top glass (second glass substrate) is cut to a depth of 0.500 mm, or whatever the thickness of the protective layer is, and directly above the original glass cuts in operation 838, as illustrated in FIG. 51. In operation 840, by using a thinner blade 1016 than that which is used to cut the glass, the retarder/PSA layer is cut to a depth of 0.800 mm below the surface of the top glass, as shown in FIG. 52. The blade used here is a 1.6 mil blade made of diamond particles in a nickel binder and is typically used for cutting soft materials. As shown in FIG. 53, in operation 842, the silicon wafer is partially cut from the backside. Again, it is only partially cut to prevent water from entering the air gap. The individual devices can then be separated at the cut location as in operation 844 and are ready to be filled with liquid crystal as in operation 846. FIG. 54 shows the final product of the singulated integrated circuit unit 1018 after all cuts have been made.

Figure 43A:
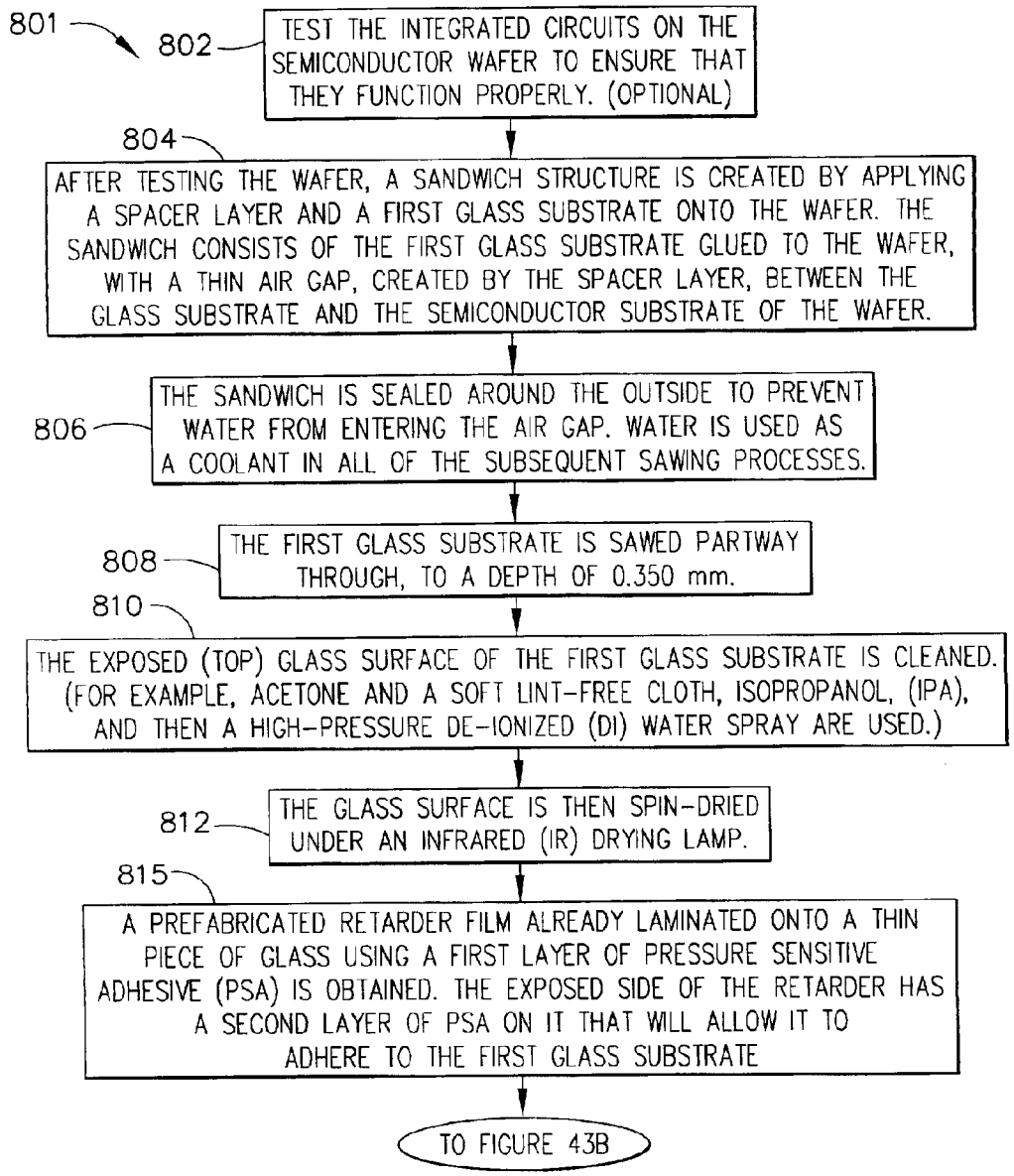
FIGS. 43a, 43b, and 43c show an alternate embodiment for the method shown in FIGS. 42a, 42b, and 42c in which one of the components is prefabricated and readily available.
Figure 43B:
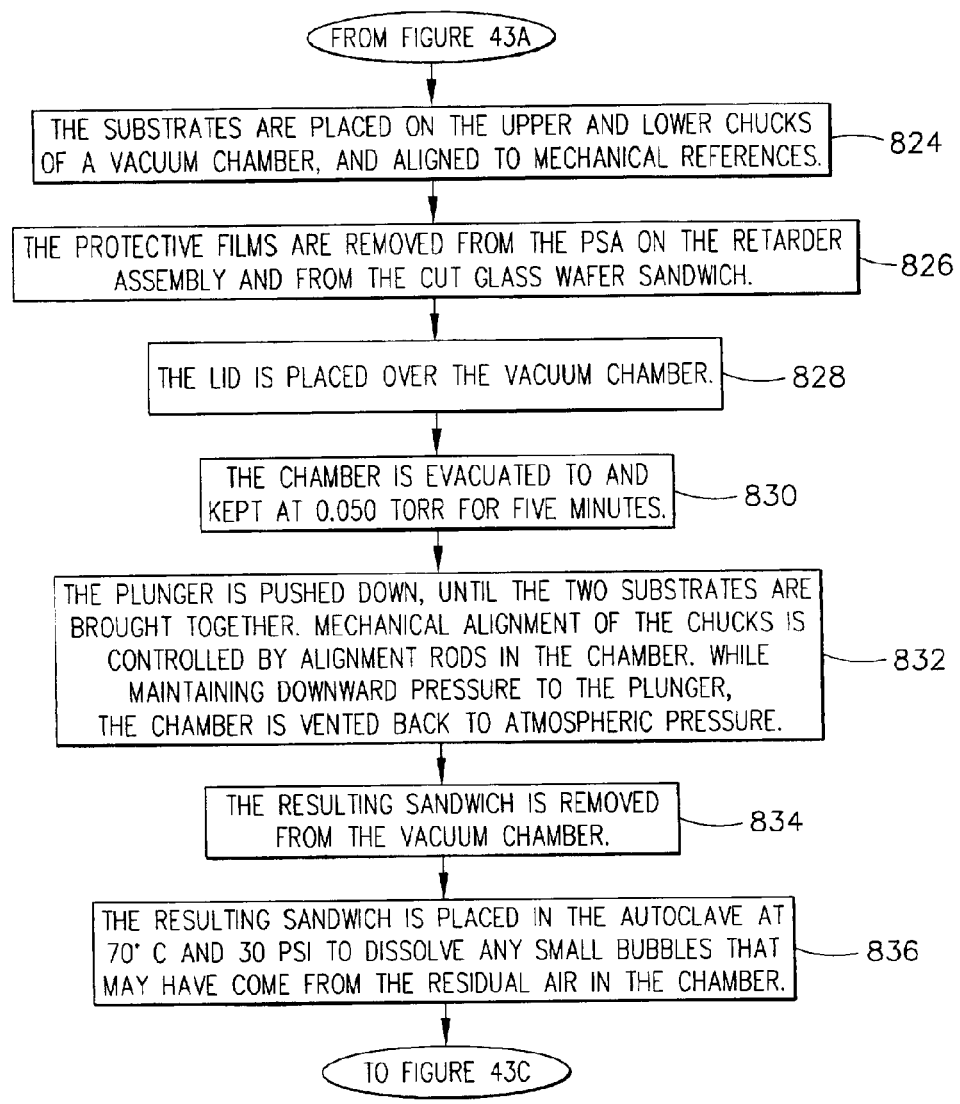
Figure 43C:
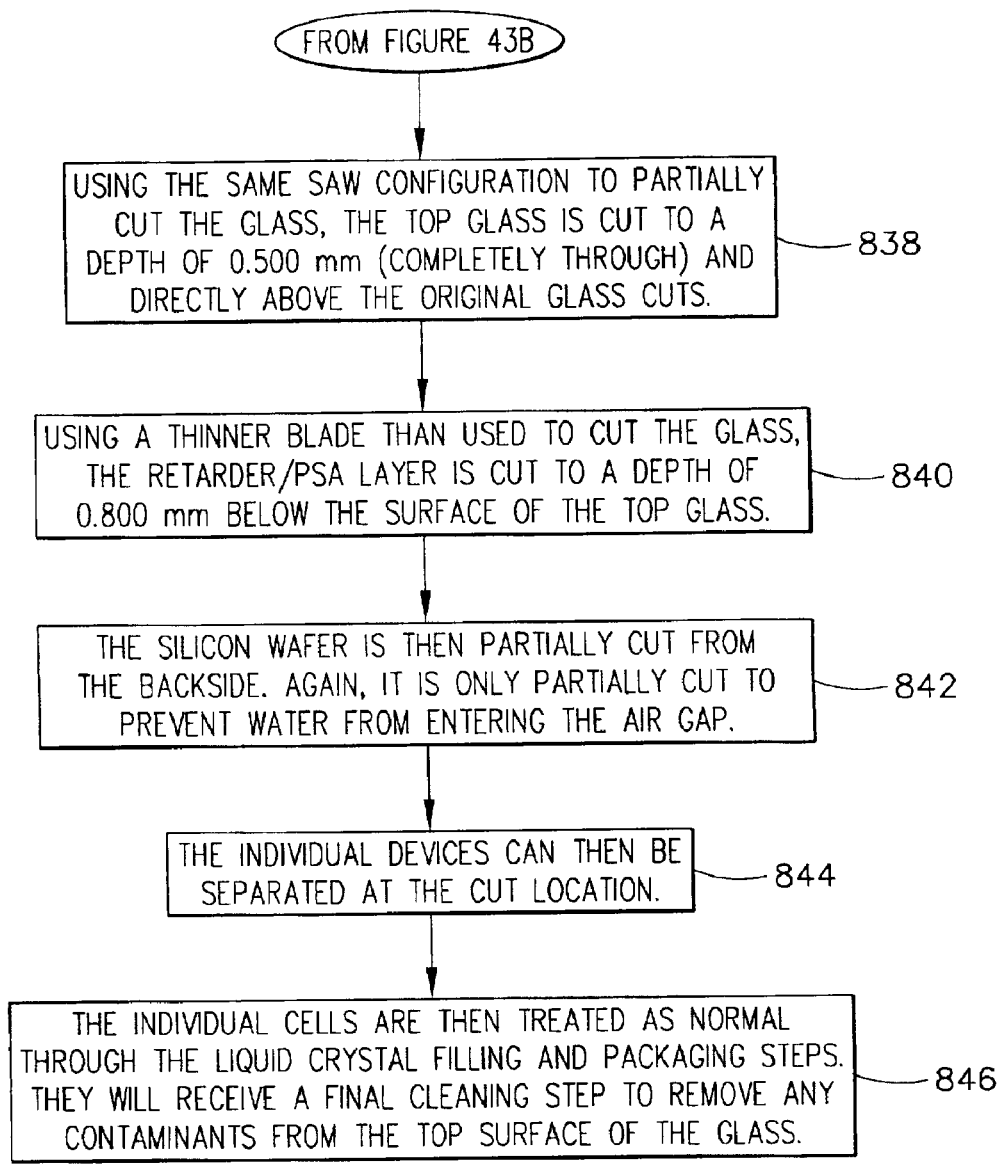
Figure 55:
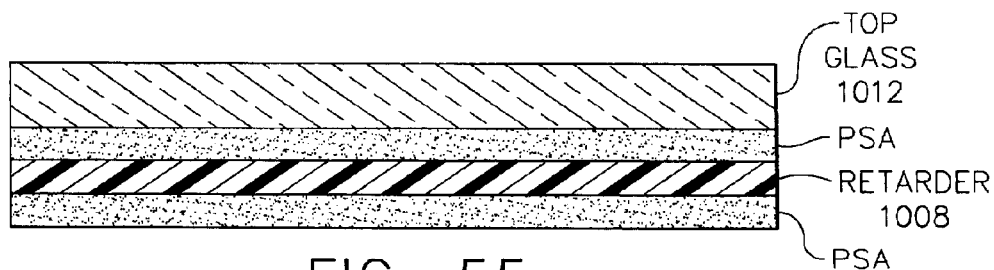
FIG. 55 illustrates an alternate embodiment of the invention in which the layer that is fused onto the substrate is a top glass/PSA/retarder/PSA assembly layer.
Figure 56:
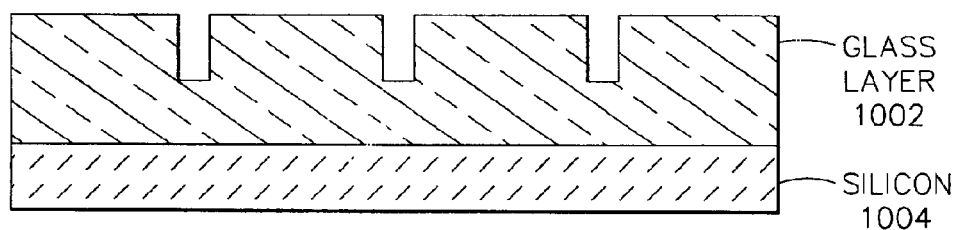
FIG. 56 shows the glass substrate onto which the top glass/PSA/retarder/PSA assembly layer is fused.

FIG. 43 is a flow chart describing the alternate embodiment of the invention in which few steps are eliminated. Instead of having to prepare the retarder and top glass assembly, the embodiment uses a prefabricated top glass/PSA/retarder/PSA assembly that can be attached directly to the wafer sandwich using a similar methodology to that described above in FIG. 42. The prefabricated assembly as used in the alternate embodiment is shown in FIG. 55. The only difference in this procedure is that steps 814, 816, 818 are eliminated and a new step 815 is added in which we obtain a retarder film that is already laminated onto a thin piece of glass. The exposed side of the retarder has a layer of PSA on it that will allow it to adhere to the cut first glass substrate. FIG. 56 illustrates the cut first glass substrate that is over the silicon layer.

The sawing process described above is one embodiment of what can be done In the process described, the first cut glass substrate is precut on the display sandwich. The protected optical layer(s) (e.g. retarder) is assembled onto the first glass substrate and the protective layer of glass is then cut through. The optical layer(s) are cut using a thinner blade. The back-side of the silicon is partially cut and the plurality of integrated circuit devices is singulated to create individual displays.

Figure 44A:
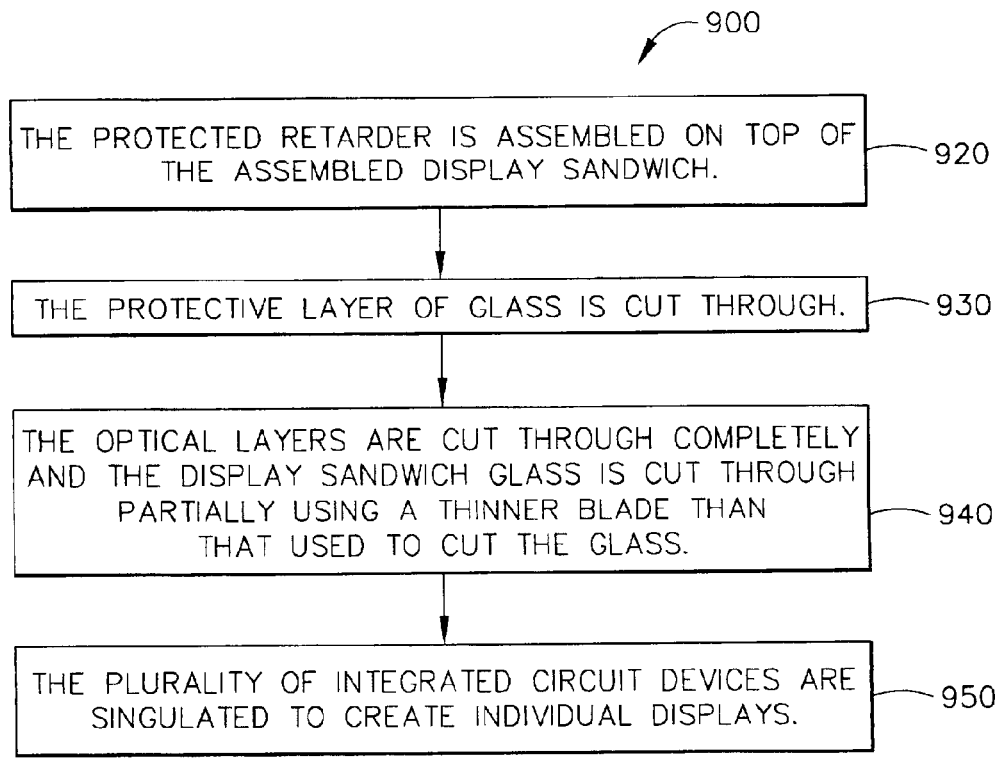
FIGS. 44A, 44B, and 44C describe some of the variations that can be used in the sawing process.
Figure 44B:
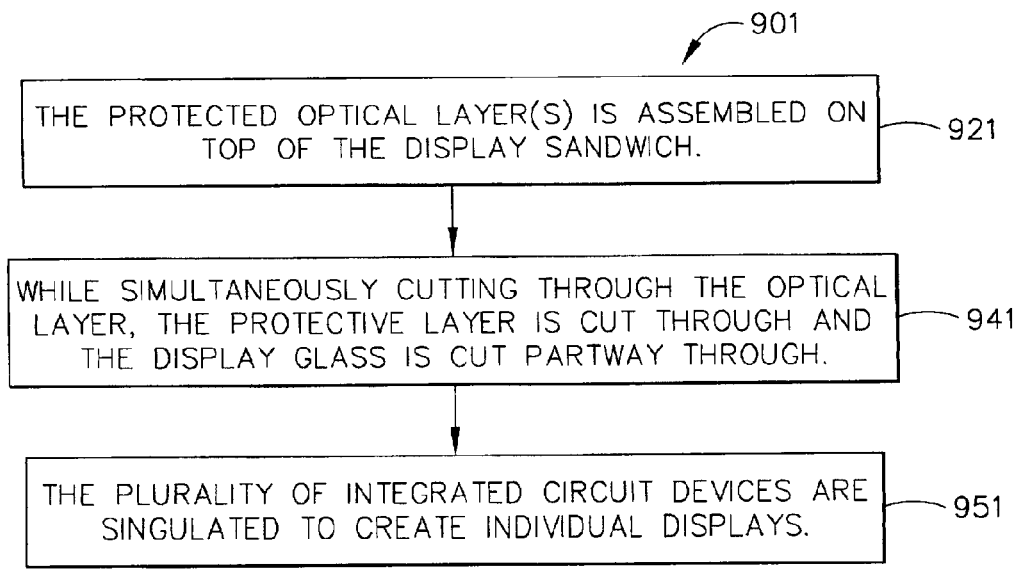
Figure 44C:
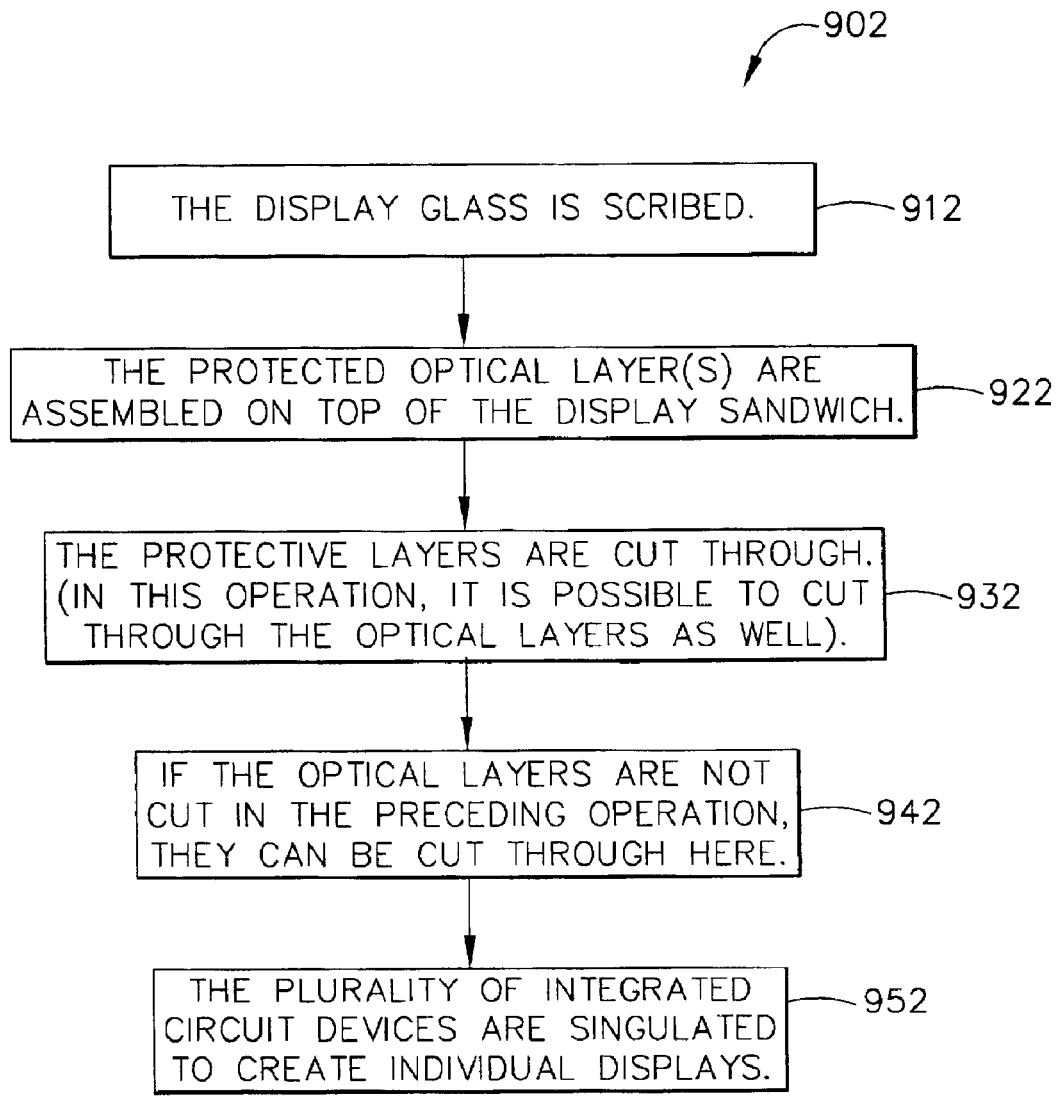

FIGS. 44A, 44B, and 44C are flow charts which detail three alternative embodiments of the sawing process. All of the processes start with an assembled display sandwich. FIG. 44A details method 900 in which the protected retarder is assembled on top of the display sandwich in operation 920. In operation 930, the protective layer of glass is cut through. The optical layers are cut through completely while the first glass substrate 1002 of the display sandwich is cut through partially using a thinner blade that used to cut the glass in operation 940. In operation 950, the plurality of integrated circuit devices are singulated to create individual displays.

FIG. 44B details method 901 in which the protected optical layer(s) are assembled on top of the display sandwich in operation 921. In operation 941, the protective layer is cut through while simultaneously cutting through the optical layer. The display glass (first glass substrate) is cut partway through. In operation 951, the plurality of integrated circuit devices are singulated to create individual displays.

FIG. 44C details yet another alternate embodiment. In method 902, the display glass (first glass substrate) is scribed in operation 912. In operation 922, the protected optical layer(s) are assembled on top of the display sandwich. In operation 932, the protective layers are cut through. It is possible to also cut through the optical layer(s) in this operation. If the optical layer(s) are not cut through in the preceding operation, they can be cut through in operation 942. The plurality of integrated circuit devices is singulated to create individual displays in operation 952.

Figure 57:
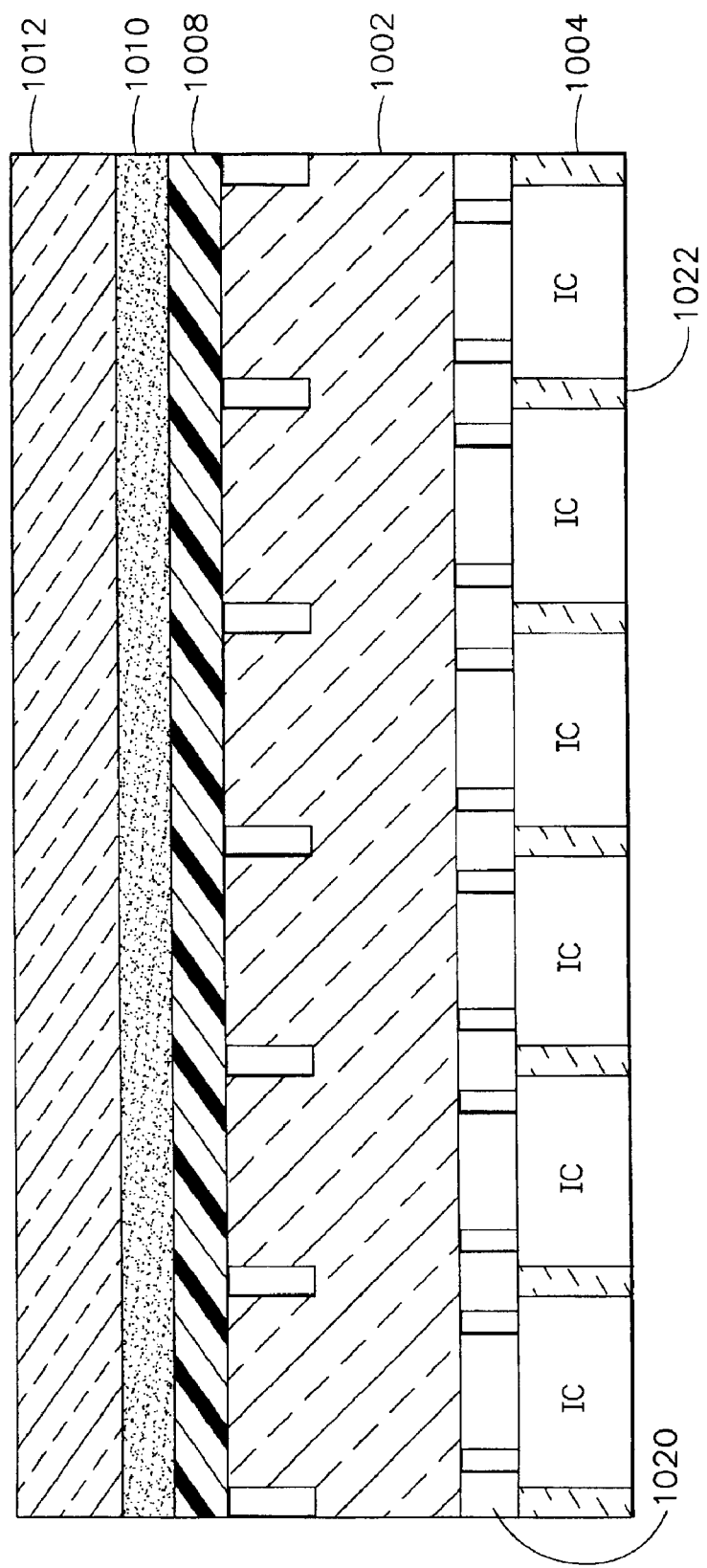
FIG. 57 shows a plurality of integrated circuits with multiple gaps created by spacers. These gaps are later filled with a liquid crystal material.

FIG. 57 shows the plurality of integrated circuits with multiple air gaps created by a spacer layer. The figure illustrates the wafer scale process as a completed apparatus before the integrated circuits have been singulated. What is shown is spacer layer 1020 directly attached to semiconductor wafer 1004. Directly above spacer layer 1020 is first glass substrate 1002. It will be appreciated that the spacer layer may be arranged relative to each integrated circuit (IC) so that the contact pads are accessible for making electrical contacts to the IC. The regions 1022 show the areas between the IC's which will be sacrificed in the process of sawing and/or breaking apart the IC's in order to singulate the IC's. Typically, sawing, from the backside of wafer 1004, will cut at least partially through the wafer (see FIG. 53) before the IC's are snapped apart.

Figure 58:
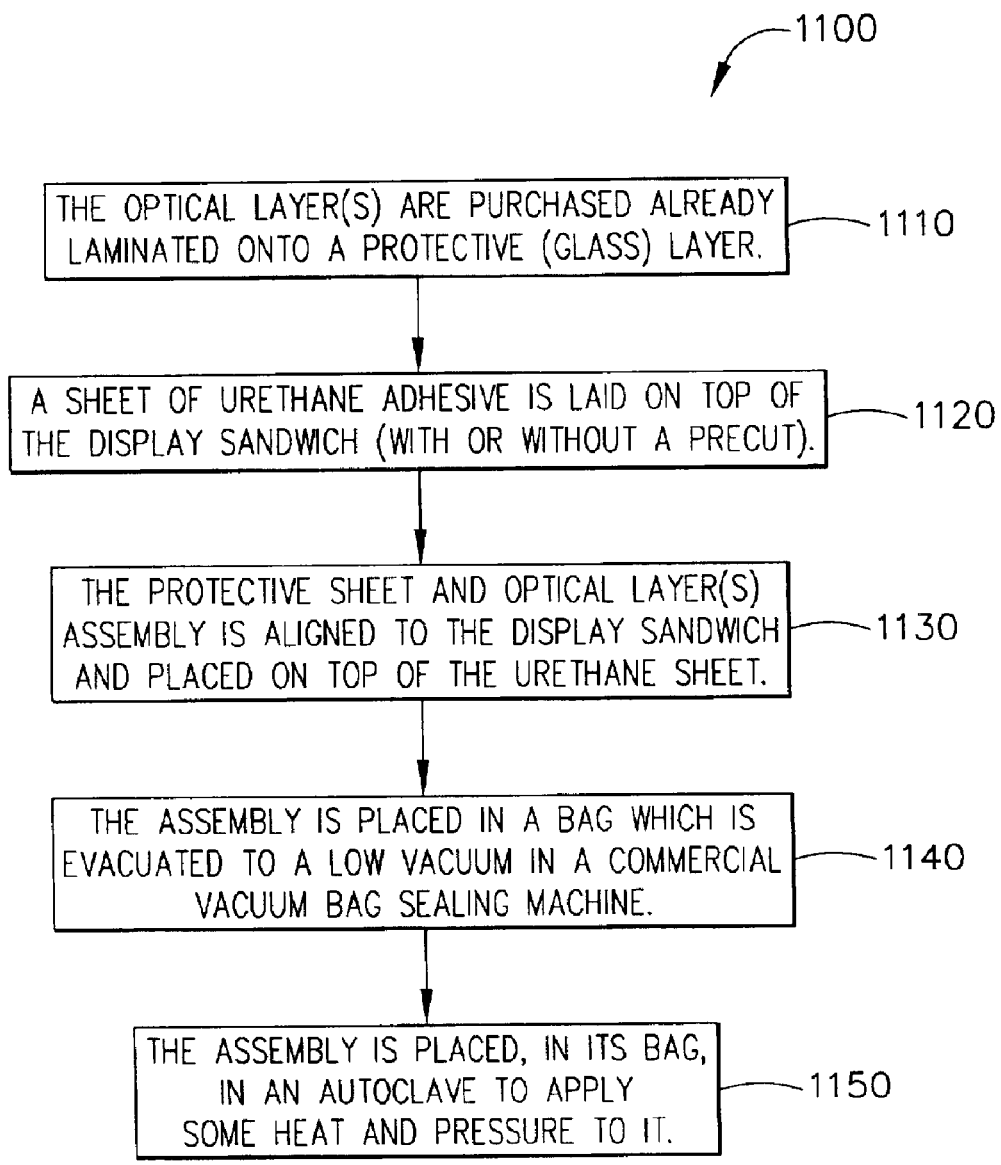
FIG. 58 is a detailed description of an alternative adhesive system that can be used in place of the PSA.

FIG. 58 shows an alternative adhesive system 1100 that can be used in this process. PSA is typically used in the industry, however, an alternative adhesive system that uses urethane can also be used for bonding the optical layer(s) to the glass substrates. Operation 1120 details that the urethane is supplied in sheets which can be laid out over a first substrate (e.g. the display sandwich with or without a pre-cut as in operation 1110). The second substrate (e.g. the optical layer(s) which have already been laminated to a protective glass layer) is aligned to the first substrate display sandwich in operation 1130 on top of the urethane sheet. The assembly is placed in a bag in operation 1140 and the extra air is taken out of the lamination by evacuating to a low vacuum in a commercial vacuum bag sealing machine. If the assembly is sealed in a bag, an autoclave can be used in operation 1150 to apply heat and pressure to ensure that the urethane forms a good bond.

The present invention may be used with displays which are not LCOS displays, such as passive matrix displays which include a set of electrodes as a display driver. A display driver drives a display based upon an electrical input.

In the preceding detailed description, the invention is described with reference to specific embodiments thereof. It will, however, be evident that various modifications and changes may be made thereto without departing from the broader scope of subject matter as set out in the claim terms. The written and drawing specification is, accordingly, to be regarded in an illustrative rather than a restrictive sense.

What is claimed is:

1. A method of fabricating a light modulation system having a semiconductor substrate, said method comprising:

applying a first glass layer over said semiconductor substrate wherein said first glass layer has a transparent electrode and a plurality of gaps between said first glass layer and said semiconductor substrates;

applying an optical element layer over said first glass layer which includes a plurality of integrated circuits, each of which is capable of creating a separate display device;

applying a second glass layer over said optical element layer; and singulating said plurality of integrated circuits.

2. A method as in claim 1, further comprising:

introducing a liquid crystal material into one of said gaps after said singulating.

3. A method as in claim 2 wherein said semiconductor substrate comprises a mono-crystalline silicon material.

4. A method as in claim 2 further comprising:

creating a spacer layer over said semiconductor substrate, said spacer layer creating said plurality of gaps.

5. A method as in claim 4 wherein said semiconductor substrate is a semiconductor wafer that has said plurality of integrated circuits fabricated into said semiconductor substrate.

6. A method of fabricating a light modulation system having a semiconductor substrate, said method comprising:

applying a first glass layer over said semiconductor substrate;

cutting said first glass layer prior to applying an optical element layer;

applying said optical element layer over said first glass layer which includes a plurality of integrated circuits, each of which is capable of creating a separate display device;

applying a second glass layer over said optical element layer; and singulating said plurality of integrated circuits.

7. A method as in claim 6 wherein said optical element layer is applied over said first glass layer by lamination.

8. A method of fabricating a light modulation system having a semiconductor substrate, said method comprising:

applying a first glass layer over said semiconductor substrate;

applying an optical element layer over said first glass layer which includes a plurality of integrated circuits, each of which is capable of creating a separate display device, wherein said optical element layer comprises an optical retarder layer which is one of a uniaxial retarder or a biaxial retarder;

applying a second class layer over said optical element layer; and singulating said plurality of integrated circuits.

9. A method of fabricating a light modulation system having a semiconductor substrate, said method comprising:

applying a first glass layer over said semiconductor substrate;

applying an optical element layer over said first glass layer which includes a plurality of integrated circuits, each of which is capable of creating a separate display device, wherein said optical element layer comprises an optical retarder layer that comprises a first retarder element and a second retarder element that are laminated together;

applying a second glass layer over said optical element layer; and singulating said plurality of integrated circuits.

10. A method of fabricating a light modulation system having a semiconductor substrate, said method comprising:

applying a first glass layer over said semiconductor substrate;

applying an optical element layer over said first class layer which includes a plurality of integrated circuits, each of which is capable of creating a separate display device, wherein said optical element layer comprises an optical polycarbonate retarder layer;

applying a second class layer over said optical element layer; and singulating said plurality of integrated circuits.

11. A method of fabricating a light modulation system having a semiconductor substrate, said method comprising:

applying a first glass layer over said semiconductor substrate;

applying a an optical element layer over said first class layer which includes a plurality of integrated circuits, each of which is capable of creating a separate display device, wherein said optical element layer comprises an optical liquid crystal polymer retarder layer;

applying a second glass layer over said optical element layer; and singulating said plurality of integrated circuits.

12. A method of fabricating a light modulation system having a semiconductor substrate, said method comprising:

applying a first glass layer over said semiconductor substrate;

applying an optical element layer over said first glass layer which includes a plurality of integrated circuits, each of which is capable of creating a separate display device;

applying a second glass layer over said optical element layer, wherein said optical element layer is attached to said second glass layer by one of (a) a pressure sensitive adhesive; (b) a urethane adhesive; or (c) an ultraviolet cured adhesive; and singulating said plurality of integrated circuits.

13. A method of fabricating a light modulation system having a semiconductor substrate, said method comprising:

applying a first glass layer over said semiconductor substrate;

applying an optical element layer over said first glass layer which includes a plurality of integrated circuits, each of which is capable of creating a separate display device, wherein said optical element layer is attached to said first glass layer by one of (a) a pressure sensitive adhesive; (b) a urethane adhesive; or (c) an ultraviolet cured adhesive;

applying a second glass layer over said optical element layer; and singulating said plurality of integrated circuits.

14. A method of fabricating a light modulation system having a semiconductor substrate, said method comprising:

applying a first glass layer over said semiconductor substrate;

applying an optical element layer over said first glass layer which includes a plurality of integrated circuits, each of which is cable of creating a separate display device, wherein said optical element layer comprises an optical retarder layer;

applying a second glass layer over said optical element layer, wherein said optical element layer is attached to said second glass layer by an adhesive which is different than an adhesive which attaches said optical element layer to said first glass layer; and singulating said plurality of integrated circuits.

15. A method of fabricating a light modulation system having a semiconductor substrate, said method comprising:

applying a first class layer over said semiconductor substrate:

applying an optical element layer over said first glass layer which includes a plurality of integrated circuits, each of which is capable of creating a separate display device;

applying a second glass layer over said optical element layer:

cutting with a first cut said second glass layer after said first glass layer and said second glass layer and said optical element layer have been applied over said semiconductor substrate;

cutting with a second cut, after said first cut, said first glass layer and said optical element layer; and singulating said plurality of integrated circuits.

16. A method as in claim 15 wherein said first cut has a larger dimension that said second cut.

17. A method as in claim 16 wherein said larger dimension is a width, which is related to a width of a blade used to cut.

18. A method of fabricating a light modulation system having a semiconductor substrate, said method comprising:

applying a first glass layer over said semiconductor substrate;

applying an optical element layer over said first glass layer which includes a plurality of integrated circuits, each of which is capable of creating a separate display device;

applying a second glass layer over said optical element layer, wherein said second glass layer has an optical coating; and singulating said plurality of integrated circuits.

19. A method as in claim 18 wherein said optical coating is an anti-reflective coating.

20. A method as in claim 6 wherein said cutting is a partial cut through said first glass layer.

21. A method as in claim 6 further comprising:

cutting said optical element layer after applying said optical element layer over said first glass layer and before applying said second glass layer.

22. A method as in claim 21 wherein said cutting of said optical element layer comprises laser cutting of said optical element layer.

23. A method as in claim 18 wherein said second glass layer is applied over said optical element layer before said optical element layer is applied over said semiconductor substrate.

24. A method of fabricating a light modulation system having a substrate, said method comprising:

applying a first class layer over said substrate, wherein said first glass layer has a first plurality of transparent electrodes and a plurality of gaps between said first glass layer and said substrate;

applying an optical element layer over said first glass layer which includes a plurality of display drivers, each of which is capable of creating a separate display device;

applying a second glass layer over said optical element layer; and singulating said plurality of display drivers.

25. A method as in claim 24 further comprising:

introducing a liquid crystal material into one of said gaps after said singulating.

26. A method as in claim 25 wherein said substrate comprises a second plurality of electrodes.

27. A method as in claim 25 further comprising:

creating a spacer layer over said substrate, said spacer layer creating said plurality of gaps.

28. A method as in claim 27 wherein said substrate comprises an Indium Tin Oxide (ITO) layer and wherein each display driver comprises a set of parallel electrodes.

29. A method as in claim 28 further comprising:

cutting said first glass layer prior to applying said optical element layer, said optical element layer being applied over said first glass layer.

30. A method as in claim 29 wherein said optical element layer is applied over said first glass layer by lamination.

31. A method of fabricating a light modulation system having a substrate, said method comprising:

applying a first glass layer over said substrate:

applying an optical element layer over said first glass substrate which includes a plurality of display drivers, each of which is capable of creating a separate display device, wherein said optical element layer comprises an optical retarder layer which is one of a uniaxial retarder or a biaxial retarder;

applying a second glass layer over said optical element layer; and singulating said plurality of display drivers.

32. A method of fabricating a light modulation system having a substrate, said method comprising:

applying a first glass layer over said substrate;

applying an optical element layer over said first glass substrate which includes a plurality of display drivers, each of which is capable of creating a separate display device, wherein said optical element layer comprises an optical retarder layer which comprises a first retarder element and a second retarder element that are laminated together;

applying a second glass layer over said optical element layer; and singulating said plurality of display drivers.

33. A method of fabricating a light modulation system having a substrate, said method comprising:

applying a first glass layer over said substrate;

applying an optical element layer over said first glass substrate which includes a plurality of display drivers, each of which is capable of creating a separate display device, wherein said optical element layer comprises an optical retarder layer which comprises a polycarbonate retarder;

applying a second glass layer over said optical element layer; and singulating said plurality of display drivers.

34. A method of fabricating a light modulation system having a substrate, said method comprising:

applying a first glass layer over said substrate;

applying an optical element layer over said first glass substrate which includes a plurality of display drivers, each of which is capable of creating a separate display device;

applying a second glass layer over said optical element layer, wherein said optical element layer is attached to said second glass layer by one of (a) a pressure sensitive adhesive; (b) a urethane adhesive; or (c) an ultraviolet cured adhesive; and singulating said plurality of display drivers.

35. A method of fabricating a light modulation system having a substrate, said method comprising:

applying a first glass layer over said substrate;

applying an optical element layer over said first glass substrate which includes a plurality of display drivers, each of which is capable of creating a separate display device, wherein said optical element layer is attached to said first glass layer by one of (a) a pressure sensitive adhesive; (b) a urethane adhesive; or (c) an ultraviolet cured adhesive;

applying a second class layer over said optical element layer; and singulating said plurality of display drivers.

36. A method of fabricating a light modulation system having a substrate, said method comprises:

applying a first glass layer over said substrate;

applying an optical element layer over said first glass substrate which includes a plurality of display drivers, each of which is capable of creating a separate display device, wherein said optical element layer comprises an optical retarder layer which comprises a liquid crystal polymer retarder;

applying a second glass layer over said optical element layer, wherein said optical element layer is attached to said second glass layer by an adhesive which is different than an adhesive which attaches the optical element layer to said first glass layer; and singulating said plurality of display drivers.

37. A method of fabricating a light modulation system having a substrate, said method comprising:

applying a first glass layer over said substrate;

applying an optical element layer over said first glass substrate which includes a plurality of display drivers, each of which is capable of creating a separate display device;

applying a second class layer over said optical element layer;

cutting with a first cut said second glass layer after said first glass layer and said second glass layer and said optical element layer have been applied over said substrate;

cutting with a second cut, after said first cut, said first glass layer and said optical element layer; and singulating said plurality of display drivers.

38. A method as in claim 37 wherein said first cut has a larger dimension that said second cut.

39. A method as in claim 38 wherein said larger dimension is a width, which is related to a width of a blade used to cut.

40. A method of fabricating a light modulation system having a substrate, said method comprising:

applying a first glass layer over said substrate;

applying an optical element layer over said first glass substrate which includes a plurality of display drivers, each of which is capable of creating a separate display device;

applying a second glass layer over said optical element layer, wherein said second glass layer has an optical coating; and singulating said plurality of display drivers.

41. A method as in claim 40 wherein said optical coating is an anti-reflective coating.

42. A method as in claim 29 wherein said cutting is a partial cut through said first glass layer.

43. A method as in claim 29 further comprising:

cutting said optical element layer after applying said optical element layer over said first glass layer and before applying said second glass layer.

44. A method as in claim 43 wherein said cutting of said optical element layer comprises laser cutting of said optical element layer.

45. A method as in claim 40 wherein said second glass layer is applied over said optical element layer before said optical element layer is applied over said substrate.

* * * * *